United States Patent
Gupta et al.

(10) Patent No.: US 10,832,789 B1
(45) Date of Patent: Nov. 10, 2020

(54) SYSTEM COUNTERMEASURE FOR READ OPERATION DURING TLC PROGRAM SUSPEND CAUSING ADL DATA RESET WITH XDL DATA

(71) Applicant: Western Digital Technologies, Inc., San Jose, CA (US)

(72) Inventors: Mahim Gupta, San Jose, CA (US); Rohan Dhekane, San Jose, CA (US); Aaron Lee, San Jose, CA (US)

(73) Assignee: Western Digital Technologies, Inc., San Jose ( * ) Notice: Subject to any disclaimer, the term of this patent is extended or adjusted under 35 U.S.C. 154(b) by 0 days.

(21) Appl. No.: 16/440,018

(22) Filed: Jun. 13, 2019

(51) Int. Cl.
*G11C 29/38* (2006.01)
*G11C 29/44* (2006.01)
*G11C 16/10* (2006.01)
*G11C 11/56* (2006.01)
*G11C 16/26* (2006.01)
*G11C 16/04* (2006.01)

(52) U.S. Cl.
CPC .......... *G11C 29/38* (2013.01); *G11C 11/5628* (2013.01); *G11C 11/5642* (2013.01); *G11C 16/10* (2013.01); *G11C 16/26* (2013.01); *G11C 29/44* (2013.01); *G11C 16/0483* (2013.01); *G11C 2216/20* (2013.01)

(58) Field of Classification Search
CPC .................................................. G11C 29/38
See application file for complete search history.

(56) References Cited

U.S. PATENT DOCUMENTS

| | | | |
|---|---|---|---|
| 2014/0136760 A1* | 5/2014 | Sprouse | G06F 3/0641 711/103 |
| 2014/0136761 A1* | 5/2014 | Li | G11C 16/3459 711/103 |
| 2014/0136763 A1* | 5/2014 | Li | G11C 16/3459 711/103 |

* cited by examiner

*Primary Examiner* — Joseph D Torres
(74) *Attorney, Agent, or Firm* — Dickinson Wright PLLC; Steven Hurles

(57) ABSTRACT

Identifying a faulty memory die in a non-volatile memory storage system. Various methods include: commencing a programming operation of a multi-state block of a subject die, the programming operation including populating a transfer data latch with a first set of data and transferring the data to a first data latch, populating the transfer data latch with a second set of data and transferring the data to second data latch, arranging the first and second data sets in a suitable format of the multi-state block, and writing the data sets to the multi-state block; prior to populating the transfer data latch with the second data set, performing a program suspend and read operation thereby populating the transfer data latch with read data; and comparing the read data to the data contained in the first data latch and, if the comparison results in a match, identifying the subject die as faulty.

20 Claims, 29 Drawing Sheets

Initial Data

| Latch | S0 | S1 | S2 |
|---|---|---|---|
| SA  | L2 | M2 | U2 |
| ADL | L0 | M0 | U0 |
| BDL | L1 | M1 | U1 |
| CDL | L2 | M2 | U2 |
| XDL | L2 | M2 | U2 |

*FIG. 23A*

Step 1: ADL S2 to XDL S0

| Latch | S0 | S1 | S2 |
|---|---|---|---|
| SA  | L2 | M2 | U2 |
| ADL | L0 | M0 | U0 |
| BDL | L1 | M1 | U1 |
| CDL | L2 | M2 | U2 |
| XDL | U0 | M2 | U2 |

*FIG. 23B*

Step 2: BDL S2 to XDL S1

| Latch | S0 | S1 | S2 |
|---|---|---|---|
| SA  | L2 | M2 | U2 |
| ADL | L0 | M0 | U0 |
| BDL | L1 | M1 | U1 |
| CDL | L2 | M2 | U2 |
| XDL | U0 | U1 | U2 |

*FIG. 23C*

Step 3: XDL to CDL

| Latch | S0 | S1 | S2 |
|---|---|---|---|
| SA  | L2 | M2 | U2 |
| ADL | L0 | M0 | U0 |
| BDL | L1 | M1 | U1 |
| CDL | U0 | U1 | U2 |
| XDL | U0 | U1 | U2 |

*FIG. 23D*

Step 4: BDL to YBOX TMP

| Latch | S0 | S1 | S2 |
|---|---|---|---|
| SA   | L2 | M2 | U2 |
| YBOX | L1 | M1 | U1 |
| ADL  | L0 | M0 | U0 |
| BDL  | L1 | M1 | U1 |
| CDL  | U0 | U1 | U2 |
| XDL  | U0 | U1 | U2 |

*FIG. 23E*

Step 5: ADL S1 to XDL S0

| Latch | S0 | S1 | S2 |
|---|---|---|---|
| SA   | L2 | M2 | U2 |
| YBOX | L1 | M1 | U1 |
| ADL  | L0 | M0 | U0 |
| BDL  | L1 | M1 | U1 |
| CDL  | U0 | U1 | U2 |
| XDL  | M0 | U1 | U2 |

*FIG. 23F*

Step 6: SA S1 to XDL S2

| Latch | S0 | S1 | S2 |
|---|---|---|---|
| SA   | L2 | M2 | U2 |
| YBOX | L1 | M1 | U1 |
| ADL  | L0 | M0 | U0 |
| BDL  | L1 | M1 | U1 |
| CDL  | U0 | U1 | U2 |
| XDL  | M0 | U1 | M2 |

*FIG. 23G*

Step 7: BDL S1 to XDL S1

| Latch | S0 | S1 | S2 |
|-------|----|----|----|
| SA    | L2 | M2 | U2 |
| YBOX  | L1 | M1 | U1 |
| ADL   | L0 | M0 | U0 |
| BDL   | L1 | M1 | U1 |
| CDL   | U0 | U1 | U2 |
| XDL   | M0 | M1 | M2 |

*FIG. 23H*

Step 8: XDL to BDL

| Latch | S0 | S1 | S2 |
|-------|----|----|----|
| SA    | L2 | M2 | U2 |
| YBOX  | L1 | M1 | U1 |
| ADL   | L0 | M0 | U0 |
| BDL   | M0 | M1 | M2 |
| CDL   | U0 | U1 | U2 |
| XDL   | M0 | M1 | M2 |

*FIG. 23I*

Step 9: SA S0 to XDL S2

| Latch | S0 | S1 | S2 |
|-------|----|----|----|
| SA    | L2 | M2 | U2 |
| YBOX  | L1 | M1 | U1 |
| ADL   | L0 | M0 | U0 |
| BDL   | M0 | M1 | M2 |
| CDL   | U0 | U1 | U2 |
| XDL   | M0 | M1 | L2 |

*FIG. 23J*

Step 10: YBOX TMP to XDL S1

| Latch | S0 | S1 | S2 |
|-------|----|----|----|
| SA    | L2 | M2 | U2 |
| YBOX  | L1 | M1 | U1 |
| ADL   | L0 | M0 | U0 |
| BDL   | M0 | M1 | M2 |
| CDL   | U0 | U1 | U2 |
| XDL   | M0 | L1 | L2 |

*FIG. 23K*

Step 11: ADL S0 to XDL S0

| Latch | S0 | S1 | S2 |
|-------|----|----|----|
| SA    | L2 | M2 | U2 |
| YBOX  | L1 | M1 | U1 |
| ADL   | L0 | M0 | U0 |
| BDL   | M0 | M1 | M2 |
| CDL   | U0 | U1 | U2 |
| XDL   | L0 | L1 | L2 |

*FIG. 23L*

Step 12: XDL to ADL

| Latch | S0 | S1 | S2 |
|-------|----|----|----|
| SA    | L2 | M2 | U2 |
| YBOX  | L1 | M1 | U1 |
| ADL   | L0 | L1 | L2 |
| BDL   | M0 | M1 | M2 |
| CDL   | U0 | U1 | U2 |
| XDL   | L0 | L1 | L2 |

*FIG. 23M*

SYSTEM COUNTERMEASURE FOR READ OPERATION DURING TLC PROGRAM SUSPEND CAUSING ADL DATA RESET WITH XDL DATA

TECHNICAL FIELD

This disclosure relates to non-volatile memory storage systems in solid-state drives or other devices, including but not limited to flash drives or embedded/removable flash packages. More specifically, this disclosure relates to systems and methods for detecting a faulty die of a flash memory during a programming suspend operation and providing a system countermeasure thereto.

BACKGROUND

Due to emerging technology and market forces, solid-state drives (SSDs) are steadily replacing previously conventional data storage systems that rely on the rotation of magnetic mediums for reading and writing data (e.g., hard disk drives). Rather than comprising any mechanical or moving parts, solid-state memory comprises integrated circuit assemblies or interconnected flash components to provide non-volatile storage in which stored data can be persistently retained even during a planned or unplanned interruption of power. As a result, a solid-state drive is inherently faster and more robust (i.e., less susceptible to data loss and corruption), as well as consumes less power and is more compact in comparison to disk-based storage. Accordingly, non-volatile memory is a powerful storage solution with respect to many types of computing, consumer electronic, and stand-alone external storage (e.g., USB drives) devices.

With respect to some flash memory types, each individual memory cell comprises a floating gate that is positioned above and isolated from a channel region of a semiconductor substrate, wherein the floating gate is positioned between the source and drain regions. Also, a control gate is provided over and isolated from the floating gate. Accordingly, the threshold voltage ($V_{th}$) of the resulting transistor is controlled by and dependent on the amount of charge retained on the floating gate. Specifically, in a switch-like manner, the minimum amount of voltage that must be applied to the control gate before the transistor is activated to permit conduction between its source and drain is determined by the level of charge retained on the floating gate. As a result, bit-value data can be programmed onto and erased from the memory cell by changing the level of charge on a floating gate in order to change the threshold voltage characteristic of the transistor.

As explained in detail below, the number of bits that can be stored in an individual memory cell is dependent upon the number of distinct voltage ranges that may be partitioned within the threshold voltage window of that memory cell. For example, to store one bit of data (referred to as a binary data), the possible threshold voltages of the memory cell are divided into two ranges, wherein the ranges are assigned as logical data "1" and "0" respectively. A memory cell of this type of storage density may be referred to as a "single-level cell" or SLC.

By further partitioning the threshold voltage window of a memory cell into additional distinct voltage ranges, multiple levels of information may be stored. Such a memory cell may be referred to as a "multi-state cell." For example, to store two bits of data, the threshold voltage window of a cell may be partitioned into four distinct voltage ranges (or states), wherein each range is assigned a bit value equal to, for example, "11," "10," "01," and "00." Accordingly, after an erase operation, the threshold voltage is negative and may be defined as logic "11." As such, the positive threshold voltages are used for the states of "10," "01, "00." A memory cell of this storage density may be referred to as a "multi-level cell" or MLC. In a further example, in order to store three bits of data, the voltage threshold window of a cell may be partitioned into eight distinct voltage ranges (or states), with each range being assigned a bit value equal to, for example, "111," "110," "100," "010," "011," "000," "001," and "101." A memory cell of this storage density may be referred to as a "tri-level" or "triple-level cell" (TLC). The specific relationship between the data programmed into a memory cell and the threshold voltage levels of the memory cell depends upon the data encoding scheme adopted for the memory cells.

Thus, a memory device that comprises multi-state data (by incorporating MLC and/or TLC-type cells) has an increased storage capacity using the same MOSFET structure and wafer size as an SLC-type cell and, as a result, provides a comparative cost per bit savings. However, as a consequence of the increased density and the tightened tolerances between the partitioned voltage ranges of multi-state memory cells, programming occurs at a slower speed relative to a single-state memory cell because the data is programmed to multiple target threshold voltage ranges and requires a higher level of precision during programming. The increased density of a multi-state memory cell decreases the margin of error between state changes and reduces the available voltage range capacity needed to endure the stress on the silicon oxide layer over the successive programming/erase cycles. As a result, in comparison to a single-state memory cell, the durability of a multi-state storage element is significantly lower. Therefore, with respect to some applications, a memory system exclusively comprising single-state memory cells is best suited. However, in other applications, there exists technologies that employ memory die that store data primarily in memory cells storing multi-state data. In addition, in some memory systems, data is first programmed to a cache (using one or more data latches) of single-state memory cells storing binary data in order to take advantage of the faster speed of programming these memory cells. Subsequently, while the memory system is idle or busy with other data operations, the cache of single-state memory cells storing binary data transfers the stored data to multi-state memory cells storing multi-state data in order to take advantage of the larger storage capacity that is provided by the multi-state memory cells. This beneficial mechanism for transferring data from single-state memory cells to multi-state memory cells is known in the industry as a "folding" operation and is described in detail below. Whether storing binary data permanently (i.e., until erased) or as a cache, errors can occur in which the data saved in the memory cells is corrupted due to, for example, word line shorts. Therefore, in some exemplary embodiments, one or more data latches are used, for example, to preserve data that has been programmed into the memory such that, if an error is discovered, the preserved data can be re-programmed to a new cell location. Accordingly, a plurality of data latches may be employed in a flash memory system that programs data to single-state memory cells and, in some cases, to multi-state memory cells.

Accordingly, as the industry continues to achieve smaller sized memory cells with increased storage densities in order to store more data, this scaling of size entails certain performance and durability risks. In order to achieve the advantage of higher memory capacity for a fixed die size, smaller memory cells must be packed more closely together. Doing so, however, may result in a greater number of manufacturing, operation, and performance errors, such as shorting between word lines. Such errors usually corrupt any data that is stored on pages on the word lines being programmed and neighboring word lines.

The current techniques for identifying or detecting a faulty chip component of a flash memory product rely on, for example, memory die screening processes that are primarily conducted at the mount level such that an entire flash package (e.g., a ball grid array (BGA) package) may be rejected even in the case of the package containing only a single faulty die. Accordingly, a substantial number of healthy dies may be unknowingly relegated to waste as a result of this overarching approach. Further, such failures or defects are oftentimes not evident when data is initially written in the memory and verified as being within predetermined satisfactory error limits or thresholds, and only become apparent when the data is later read by a host device. At that point in time, the faulty component can lead to a catastrophic system failure that could compromise, for example, an entire drive. Therefore, it would be beneficial to be able to recognize, in situ, a faulty memory component on, for example, a die-by-die basis, during a routine memory operation, such as in the early stages of a firmware download sequence, and to provide a system-level countermeasure to a recognized victim die that will bypass or otherwise permit the continued memory operations irrespective of the presence of the victim die and with minimal system latency. In addition to significantly improving the reliability and functionality of non-volatile memory devices, such a capability will also considerably decrease the wasteful practice of package level rejects of healthy dies, thereby resulting in a higher die yield per wafer and an overall reduction in cost per GB.

SUMMARY

Various embodiments include a method for identifying a faulty memory die in a non-volatile memory system that comprises: commencing a programming operation of a multi-state block of a subject die, wherein the multi-state block includes a transfer data latch (XDL) and at least first and second data latches, and the programming operation comprises populating the transfer data latch (XDL) with a first set of data and transferring that first set of data to the first data latch, populating the transfer data latch (XDL) with a second set of data and transferring the second set of data to the second data latch, arranging the first and second sets of data in a format suitable for the multi-state block, and writing the first and second sets of data to the multi-state block; performing a program suspend and read operation after the transferring of the first set of data to the first data latch and before the populating of the transfer data latch (XDL) with the second set of data, thereby populating the transfer data latch (XDL) with a set of read data; comparing the read data contained in the transfer data latch (XDL) and the data contained in the first data latch; and if the data contained in the first data latch matches the read data, identifying the subject die as faulty.

In accordance with further embodiments, the method comprises: if the programming operation is performed according to a single-level cell (SLC) to multi-state cell folding operation and the subject die is identified as faulty, re-sensing a SLC source block of the subject die, to thereby re-populate the transfer data latch (XDL) with the first set of data; transferring the first set of data to the first data latch; and resuming populating the transfer data latch (XDL) with the second set of data and transferring the second set of data to the second data latch, arranging the first and second sets of data in a suitable format of the multi-state block, and writing the first and second sets of data to the multi-state block.

In accordance with added embodiments, the method comprises: if the programming operation is performed according to a multi-state direct write operation and if the subject die is identified as faulty, reloading a buffer into the transfer data latch (XDL), to thereby re-populate the transfer data latch (XDL) with the first set of data; transferring the first set of data to the first data latch; and resuming populating the transfer data latch (XDL) with the second set of data and transferring the second set of data to the second data latch, arranging the first and second sets of data in a suitable format of the multi-state block, and writing the first and second sets of data to the multi-state block.

Other embodiments include a memory controller, comprising: a first port that is configured to couple to a memory array, wherein the memory array has at least one subject die having a multi-state block that includes a transfer data latch (XDL) and at least first and second data latches; the memory controller is configured to: transmit a program command to the multi-state block to populate the transfer data latch (XDL) with a first set of data and transfer the first set of data to the first data latch, populate the transfer data latch (XDL) with a second set of data and transfer the second set of data to the second data latch, arrange the first and second data sets in a suitable format of the multi-state block, and write the first and second data sets to the multi-state block; transmit a program suspend and read command after the first data set is transferred to the first data latch and before the transfer data latch (XDL) is populated with the second data set, thereby populating the transfer data latch (XDL) with a set of read data; compare the read data contained in the transfer data latch (XDL) and the data contained in the first data latch; and then identify the subject die as faulty if the data contained in the first data latch matches the read data.

Additional embodiments include a non-volatile storage system configured to identify a faulty memory die thereof, wherein the system comprises: a memory array storing data in a multi-state block of a subject die of the memory array, wherein the multi-state block is programmed using a transfer data latch (XDL) and at least first data latch and a second data latch; a controller that is coupled to the memory array, wherein the controller is configured to: transmit a program command to the multi-state block to populate the transfer data latch (XDL) with a first set of data and transfer the first set of data to the first data latch, populate the transfer data latch (XDL) with a second set of data and transfer the second set of data to the second data latch, arrange the first and second sets of data in a suitable format of the multi-state block, and write the first and second sets of data to the multi-state block; transmit a program suspend and read command after the first data set is transferred to the first data latch and before the transfer data latch (XDL) is populated with the second data set, thereby populating the transfer data latch (XDL) with a set of read data; compare the read data that is contained in the transfer data latch (XDL) and the data that is contained in the first data latch; and identify the subject die as faulty if the data contained in the first data latch matches the read data.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which:

FIGS. 23A-23M illustrate an exemplary process for SLC to MLC and/or TLC data folding using the structure in FIG. 20, in accordance with exemplary embodiments;

DETAILED DESCRIPTION

Figure 1:
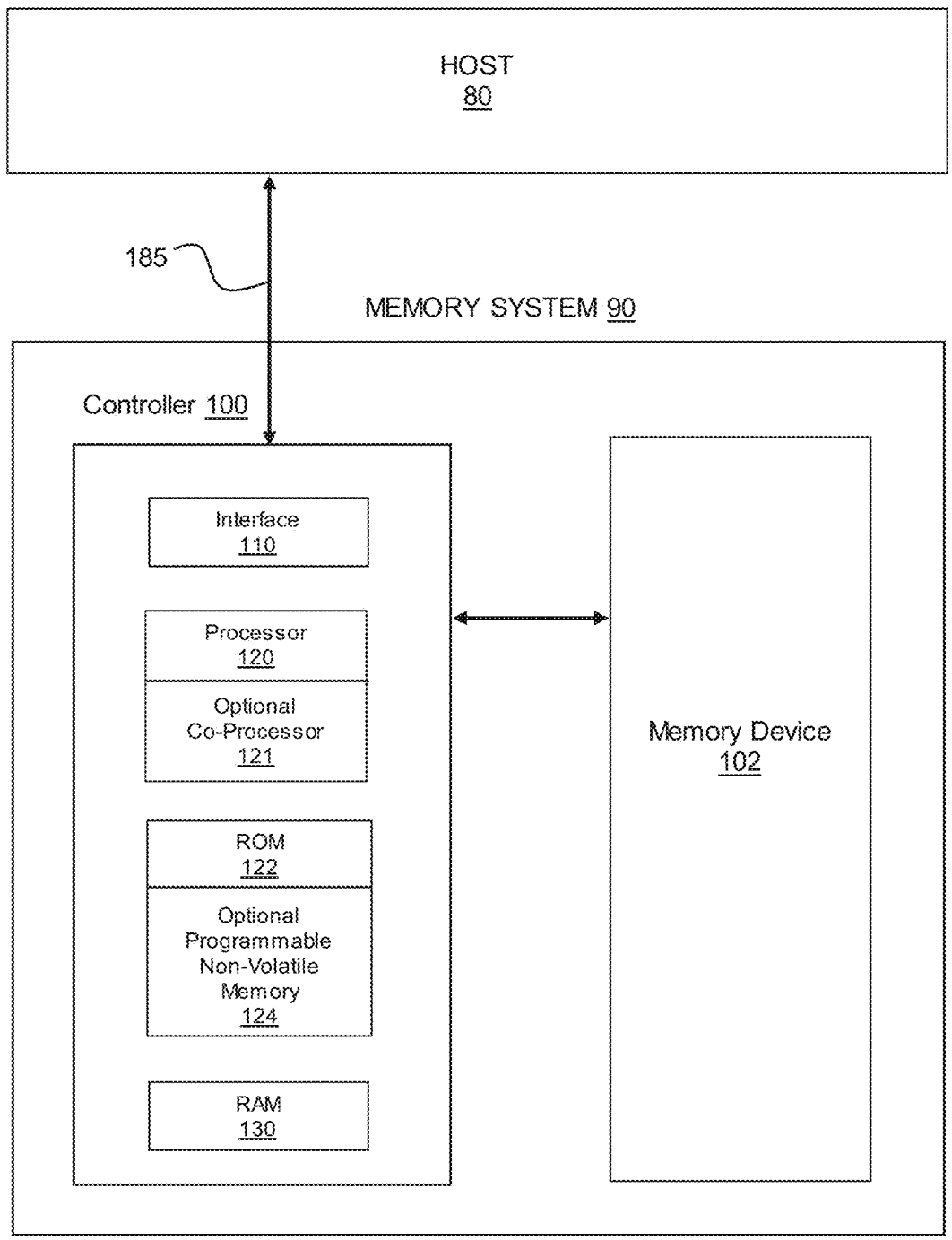
FIG. 1 is a block diagram of a memory system, in accordance with exemplary embodiments.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that comprises customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it comprises one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Thus, methods and means for these functions are described herein. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as used herein, refer to a sequence of instructions designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions designed for execution on a computer system.

Additionally, the terms "couple," "coupled," or "couples," where used herein, are intended to mean either a direct or an indirect connection. Thus, if a first device couples, or is coupled to, a second device, that connection may be by way of a direct connection or through an indirect connection via other devices (or components) and connections.

Regarding the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that comprises the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or mores," "ones or more," and/or "ones or mores" according to set theory, unless expressly specified otherwise.

Various elements of the present disclosure are described below with reference to schematic flowchart diagrams and/or schematic block diagrams depicting methods, apparatuses, systems, and computer program processes according to exemplary embodiments of the present disclosure, wherein each block, or combinations of blocks, of the schematic flowchart and/or schematic block diagrams, can be implemented by specifically-written computer program instructions. As is understood in the art, the computer program instructions are executed by a designated processor of a computer or other programmable data processing apparatus, thereby creating the mechanisms for implementing the functions, acts, and/or operations specifically set forth in the one or more blocks of the schematic flowchart and/or schematic block diagrams. Further, it is noted that, in certain alternative process implementations, the functions specified in a block may occur out of the precise order depicted in the schematic flowchart and/or block diagrams. For example, two blocks depicted in the diagram as occurring in succession may, in fact, be executed substantially at the same time (i.e., concurrently), or even executed in a reverse order, depending upon the functionality involved. In addition, other process steps and methods that are equivalent in function, logic, or effect to one or more blocks, or portions thereof, of the diagrams may be conceived and are contemplated as being within the scope of the present disclosure. Furthermore, although the schematic diagrams may depict various arrow types and directions and line types as a matter of illustration, they are not intended to limit the scope of corresponding embodiments. For instance, an arrow may represent or signify a waiting or monitoring period of unspecified duration between enumerated steps of the depicted exemplary embodiment.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Referring now to the drawings in detail and beginning with FIG. 1, there is depicted an exemplary embodiment of a memory system 90 and is an illustration of its main hardware components. In this particular embodiment, the memory system 90 operates and is in communication with a host device 80 through a host interface. Further, the memory system 90 comprises a memory device 102 whose operations are controlled by a controller 100. The host device 80 may comprise any device or system that utilizes the memory system 90 (e.g., a computing device). Accordingly, the memory system 90 may be in the form of a removable memory card or an embedded memory system. For example, the memory system 90 may be embedded in a solid-state drive that is installed in a laptop computer. In another example, the memory system 90 may be embedded within the host device 80 such that the host 80 and the memory system 90 (including controller 100) are formed on a single integrated circuit chip. In embodiments in which the memory system 90 is implemented within a memory card, the host device 80 may include a built-in receptacle for the one or more types of memory cards or flash drives (e.g., a universal serial bus (USB) port, or a memory card slot). Further, the host 80 may use adapters in which a memory card is plugged.

Still referring to FIG. 1, as described in detail below, the memory device 102 may comprise one or more memory arrays of a plurality of non-volatile memory cells that are distributed over one or more integrated circuit chips. And, in accordance with this particular embodiment, the controller 100 may include several components that may include, but are not limited to, interface circuits 110, a processor 120, ROM (read-only memory) 122, RAM (random access memory) 130, programmable non-volatile memory 124, and additional components. The controller 100 may, for example, be in the form of one or more application-specific integrated circuits (ASIC) in which the components included in such an ASIC generally depend on the particular application.

Figure 2:
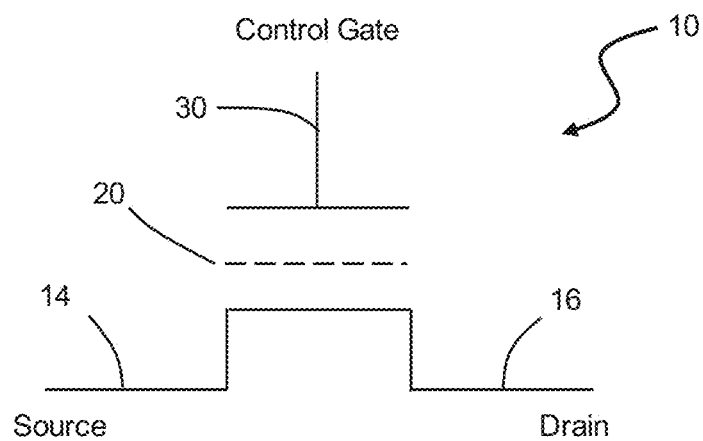
FIG. 2 schematically depicts a non-volatile memory cell, in accordance with exemplary embodiments.

With respect to the memory device 102 itself, FIG. 2 is a schematic depiction of an individual non-volatile memory cell 10 in accordance with an exemplary embodiment. As is mentioned above, the memory cell 10 may be implemented by a field-effect transistor having a charge storage unit 20, such as a floating gate or a dielectric layer. In addition, the memory cell 10 comprises a source region 14 and a drain region 16. Further, a control gate 30 is positioned above the floating gate 20. Example types of non-volatile memory cells having this general structure include, but are not limited to, electrically erasable programmable read-only memory (EEPROM) and flash EEPROM, NAND (NOT-AND)-type cells, and memory devices utilizing dielectric storage elements (e.g., NROM™). In operation, the memory state of a cell (e.g., programmed or erased) may, in accordance with certain embodiments, be read by sensing the conduction current across the source and drain electrodes of the memory cell when a reference voltage is applied to the control gate 30. More specifically, for each given charge on the floating gate 20 of a memory cell, a corresponding conduction current with respect to a fixed reference control gate voltage may be detected. Accordingly, as is described above, the range of charges programmable onto the floating gate defines a corresponding threshold voltage window or a corresponding conduction current window of the memory cell 10. Alternatively, rather than detecting the conduction current among a partitioned current window, it is possible to set the threshold voltage for a given memory state under test at the control gate 30 and detect if the resulting conduction current is higher than or lower than a threshold current (i.e., a cell-read reference current). In one such exemplary implementation, detection of the conduction current relative to a threshold current is accomplished by examining a discharge rate of the conduction current through the capacitance of the bit line.

Figure 3:
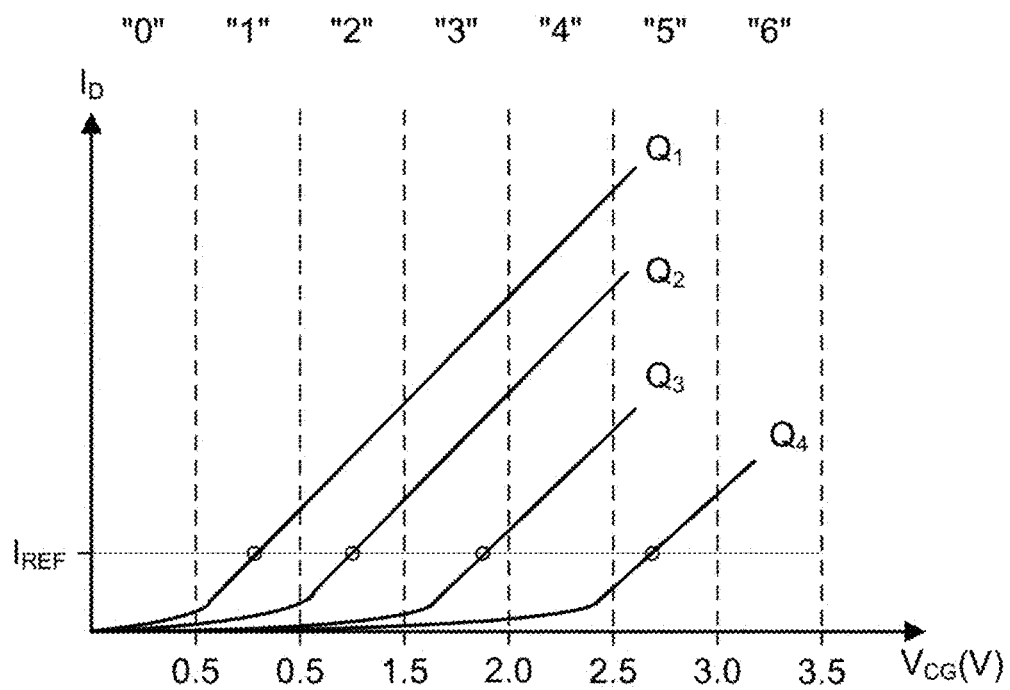
FIG. 3 depicts the relationship between a source-drain current ID and a control gate voltage $V_{CG}$ for four different charges Q1-Q4 that a floating gate of a non-volatile memory cell may be selectively storing at any one time at a fixed drain voltage, in accordance with exemplary embodiments.

FIG. 3 provides a graphical illustration of the correlation between the source-drain current ID and control gate voltage $V_{CG}$ for, for example, a non-volatile memory cell 10 having four different charge states Q1-Q4 that the floating gate may be selectively storing at any given time. As shown, with a fixed drain voltage bias, there exists four solid ID versus $V_{CG}$ curves representing four charge levels that can be programmed on a floating gate of the memory cell, wherein the four charge levels respectively correspond to four of eight possible memory states. Therefore, as an example, the threshold voltage window of a population of memory cells may range from 0.5 V to 3.5 V. In such an example, seven programmed memory states assigned as "0," "1," "2," "3," "4," "5," "6," respectively, and one erased state (which is not shown in FIG. 3), may be demarcated by partitioning the threshold window into regions at intervals of 0.5 V each. Accordingly, if a reference current, $I_{REF}$, of 2 µA is used as shown, then a cell programmed with Q1 voltage may be considered to be in a memory state "1" as its curve intersects with $I_{REF}$ in the region of the threshold window that is demarcated by the voltage range $V_{CG}$=0.5 V and 1.0 V. Similarly, Q4 is in a memory state "5."

Thus, as mentioned above, the more states that a memory cell 10 is made to store, the more finely divided is its threshold voltage window. For example, in a memory cell 10 that has a threshold voltage window ranging from −1.5 V to 5 V, thereby providing a possible maximum width of 6.5 V, and is to store 16 memory states, each state may only occupy a voltage range of from 200 mV to 300 mV. Such a narrow voltage range will require higher precision in programming and reading operations in order to achieve the required resolution.

Figure 4A:
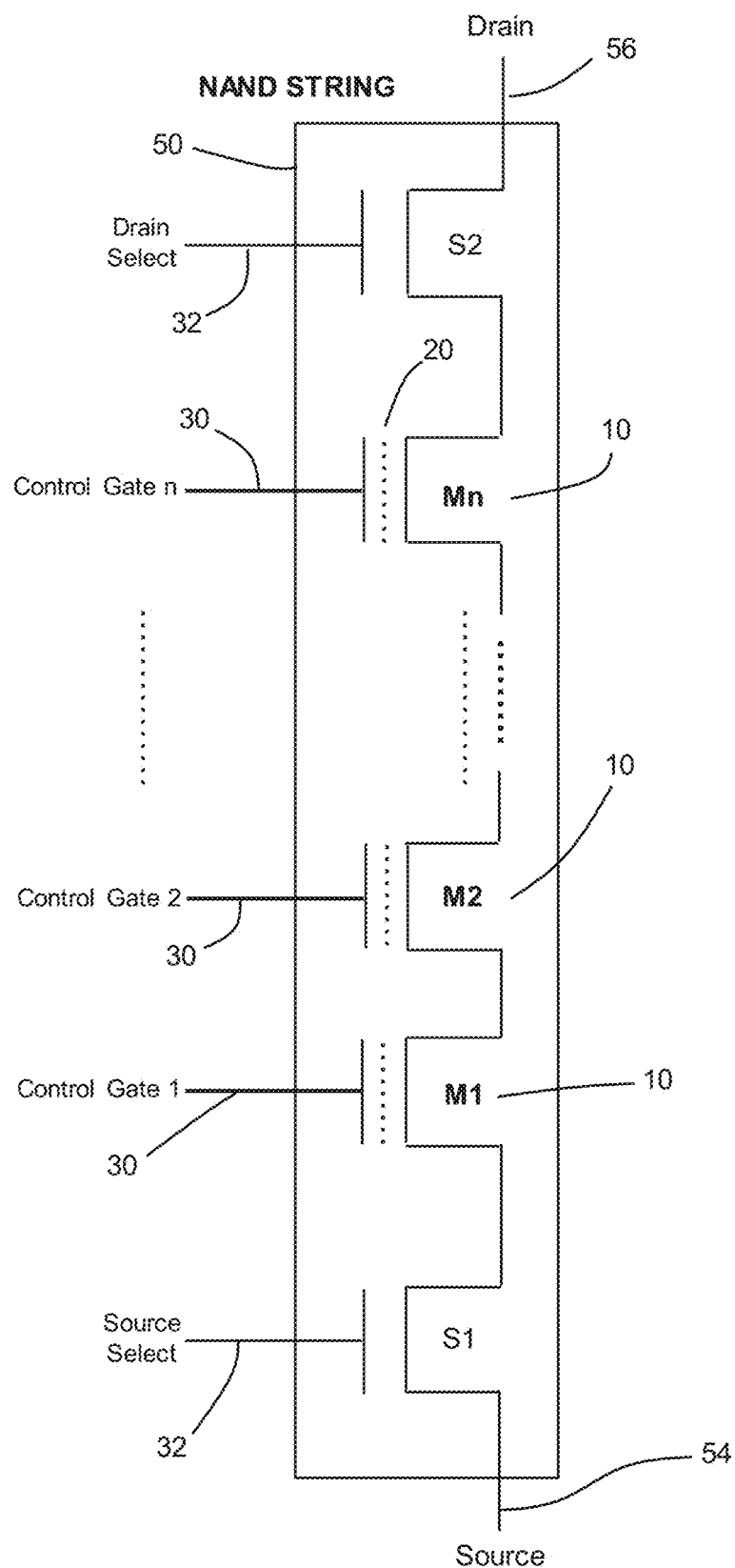
FIG. 4A schematically depicts a series of NAND-type memory cells organized into a string, in accordance with exemplary embodiments.

Individual memory cells 10 are organized into strings in which the memory cells are placed in series. For example, depicted in FIG. 4A is an exemplary embodiment of a string 50 comprising NAND-type memory cells in which the series of the cells' respective transistor elements M1, M2, . . . , Mn (wherein "n" may equal 4, 8, 16 or higher) are daisy-chained with respect to their sources and drains. Further, as discussed with respect to FIG. 3, each memory transistor 10 in the string 50 has a charge storage element 20 (e.g., a floating gate) for storing a certain amount of charge so as to represent an intended memory state of that cell. And, as explained in greater detail below, each memory transistor 10 comprises a control gate 30 that allows control over the read and write operations. Present at the source terminal 54 and drain terminal 56 of the string 50 are select transistors S1, S2 that control the transistor elements' connection to the outlying memory array. Specifically, when the source select transistor S1 is turned on, the source terminal 54 is coupled to a source line. Likewise, when the drain select transistor S2 is turned on, the drain terminal 56 is coupled to a bit line of the memory array.

Figure 4B:
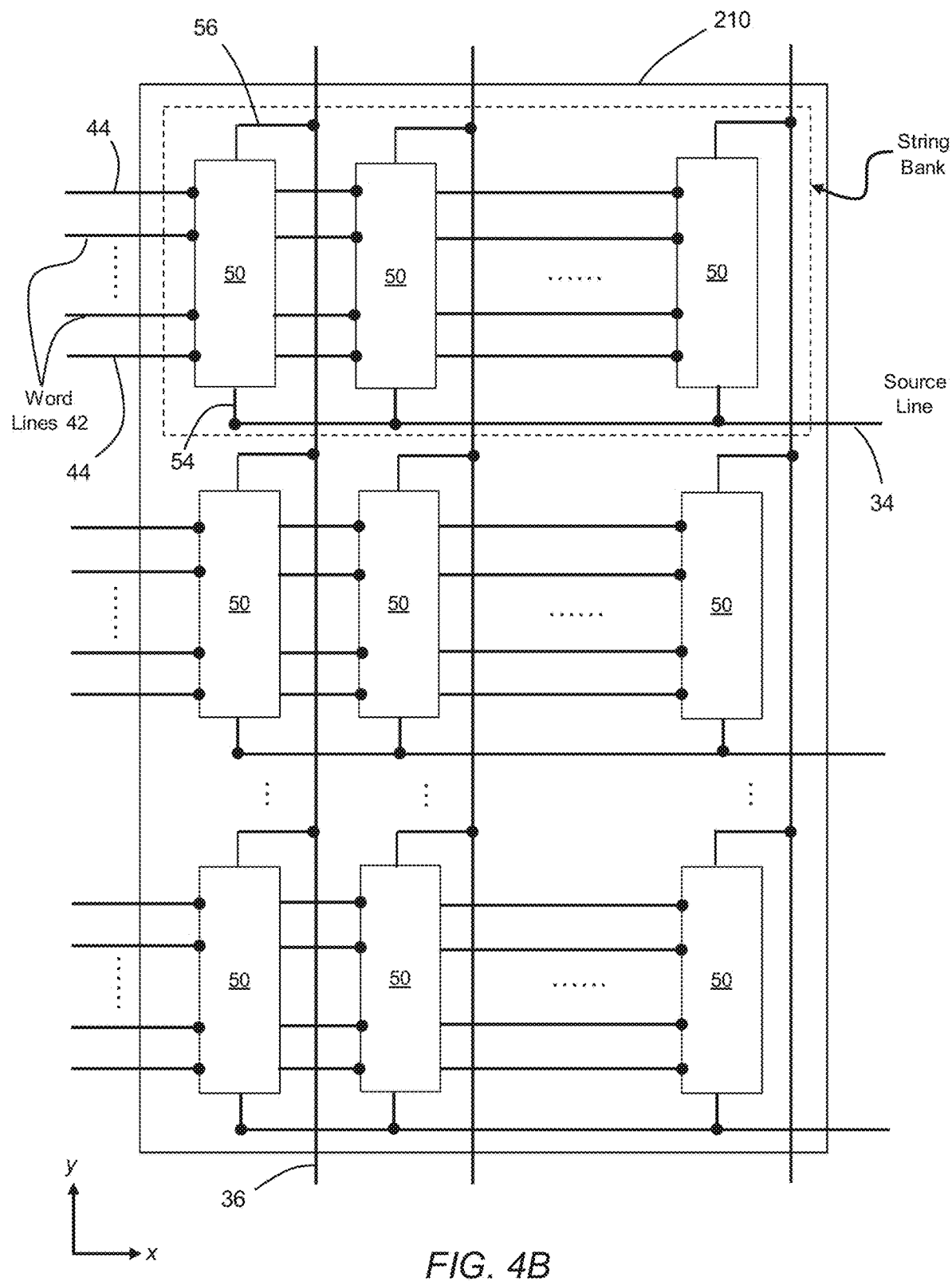
FIG. 4B schematically depicts an array of memory cells, comprising a plurality of NAND-type strings, such as the type depicted in FIG. 4A, in accordance with exemplary embodiments.

Expanding outward a hierarchical level, FIG. 4B is a schematic diagram depicting an exemplary embodiment of a memory array 210 comprised of a plurality of NAND strings 50 of the type illustrated in FIG. 4A. Along each column of NAND strings 50, a bit line 36 is coupled to the drain terminal 56 of each NAND string. In addition, along each bank of NAND strings 50, a source line 34 is coupled to the source terminals 54 of each NAND string. Further, the control gates 30 of the memory transistors 10 in a row of memory cells in the bank of NAND strings 50 are connected to the same word line 42. Accordingly, when an addressed memory transistor 10 within a NAND string 50 is read or verified during a programming operation, an appropriate voltage is applied to its control gate 30. Concurrently, the remaining non-addressed memory transistors 10 within the NAND string 50 are fully turned on by applying a sufficient voltage to their respective control gates 30. As a result, a conductive pathway is created from the source of the addressed memory transistor 10 to the source terminal 54 of NAND string 50, and from the drain of the addressed memory transistor 10 to the drain terminal 56 of the cell.

Further, the control gates 32 of the select transistors S1, S2 of each NAND string 50 in the memory array 210 provides control access to the NAND string at its source terminal 54 and drain terminal 56. The control gates 32 of the select transistors S1, S2 along a row in a bank of NAND strings 50 are connected to the same select line 44. Thus, an entire row of memory cells 10 in a bank of NAND strings 50 can be addressed by applying the appropriate voltages on the word lines 42 and select lines 44 of the bank of NAND strings 50.

Figure 5:
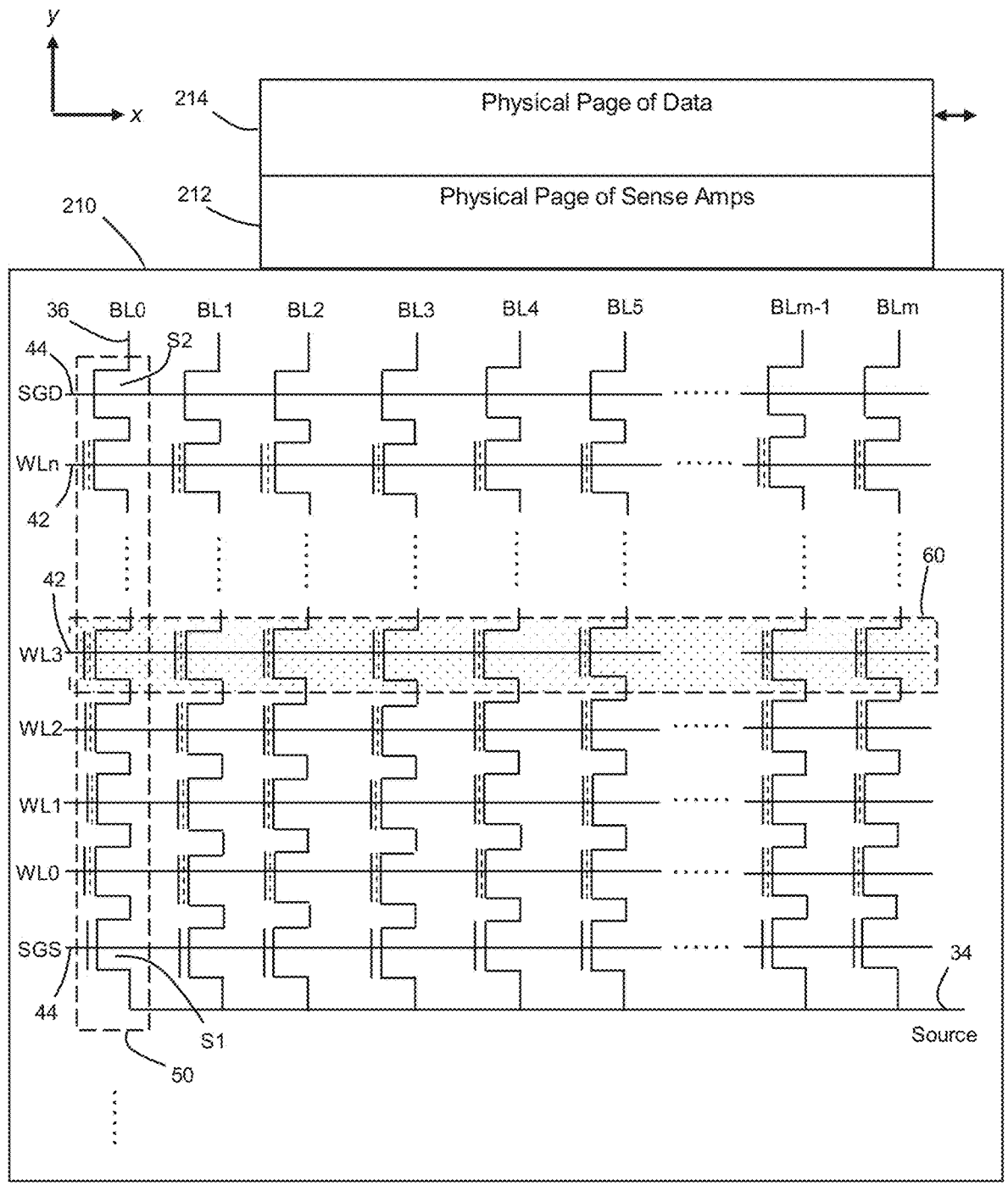
FIG. 5 depicts a page of memory cells being sensed or programmed in parallel, and in relation to a memory array organized in the NAND-type configuration, in accordance with exemplary embodiments.

Turning now to FIG. 5, there is depicted a detailed illustration of one bank of NAND strings 50 of a memory array 210 according to an exemplary embodiment thereof. This view is particularly useful in visualizing a row-by-row configuration of the memory array 210, wherein each row of the array 210 may be referred to as a "page." Accordingly, a physical page (such as page 60 denoted in FIG. 5) is a group of memory cells 10 that is enabled to be sensed or programmed in parallel. In fact, a page is the smallest unit of the memory device that may be programmed or written to. Programming of a page is accomplished by a corresponding page of sense amplifiers 212, wherein each sense amplifier may be coupled to a respective NAND string 50 via a bit line (e.g., see respective bit lines BL0, BL1, BL2, BL3, BL4, BL5, BLm−1, and BLm illustrated in FIG. 5). Thus, a page 60 is enabled by the control gates of the plurality of memory cells 10 in page 60, which are connected to a common word line 42, and each memory cell 10 of the page 60 is accessible by a sense amplifier via a bit line 36. Therefore, when programming or sensing a page 60 of memory cells 10, a programming or sensing voltage is respectively applied to the common word line (e.g., word line WL3 with respect to the page 60) together with appropriate voltages on the bit lines.

Regarding the manner in which data is programmed and erased, it is important to note that, with respect to flash memory, a memory cell must be programmed from an erased state. In other words, a floating gate 20 must first be emptied of charge, thereby placing the memory cell in an erased state, before a programming operation can subsequently add a desired amount of charge back to the floating gate 20. Thus, the level of charge on a floating gate 20 cannot be incrementally increased or decreased from its previous programmed level. Therefore, it is not possible for update data to overwrite the existing data of a memory cell 10. Rather, the update data must be programmed to a previous unwritten location.

For purposes of promoting performance in erase operations, an array 210 of memory cells 10 is, for example, divided into a large number of blocks of memory cells, wherein a block is the smallest unit of the memory device in which the memory cells contained may be erased together. Furthermore, each block of memory cells 10 may be divided into a number of physical pages 60 wherein, as mentioned above, a programming operation is conducted page by page. Accordingly, a logical page is a unit of programming or reading that contains a number of bits equal to the number of memory cells 10 in a given physical page. For example, in a memory device of the SLC-type in which one bit of data is stored in each memory cell 10, one physical page 60 stores one logical page of data. Accordingly, in a memory device of the MLC-type in which two bits of data are stored in each memory cell 10, one physical page 60 can store two logical pages of data. As such, one or more logical pages of data are typically stored in one row (i.e., page 60) of memory cells. A page 60 can store one or more sectors wherein a sector is comprised of both user data and overhead data. In an exemplary embodiment, individual pages 60 may be divided into segments in which each segment contains the fewest number of memory cells 10 that may be written at one time in a basic programming operation.

Figure 6:
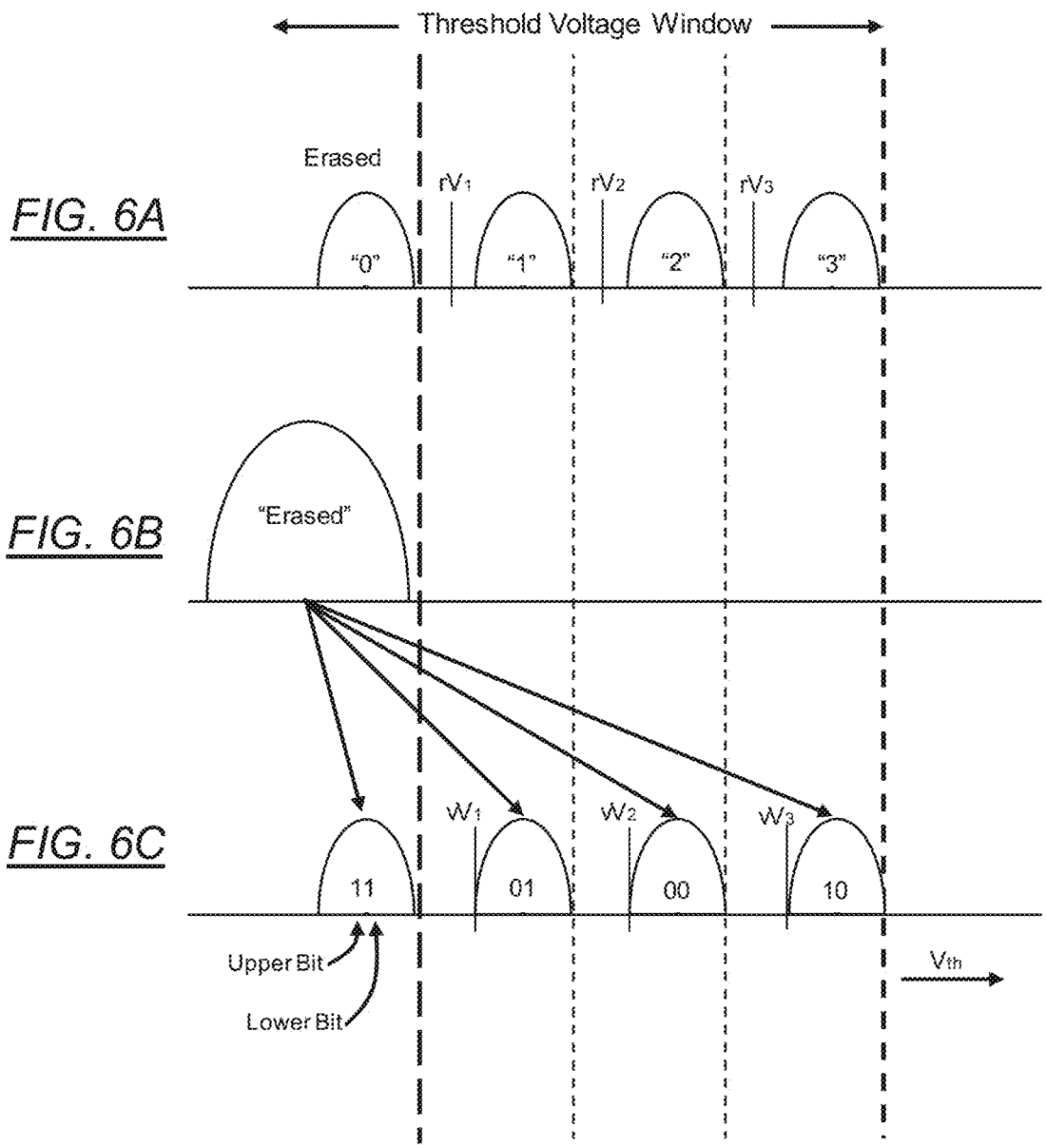
FIGS. 6A-6C depict stages of programming four states of a population of MLC-type memory cells, in accordance with exemplary embodiments.

To illustrate an exemplary embodiment of the programming stages of a MLC-type memory device comprising a population of four-state memory cells, reference is made to FIGS. 6A-6C. In FIG. 6A, there is depicted a population of memory cells in which the characteristic threshold voltage window is divided into four distinct voltage distributions wherein each distribution corresponds to a programmable memory state (i.e., memory states "0," "1," "2," and "3"). FIG. 6B illustrates an initial distribution of "erased" threshold voltages for an erased memory. In FIG. 6C, much of the memory cell population is programmed such that the initial "erased" threshold voltage of a given memory cell 10 is moved to a higher value into one of the three divided voltage zones demarcated by verify levels $vV_1$, $vV_2$, and $vV_3$. Accordingly, each memory cell can be programmed to one of the three programmable states "1," "2," and "3," or remain in the "erased" state. On a bit level, a 2-bit code having a lower bit and an upper bit can be used to represent each of the four memory states. For example, as depicted in FIG. 6C, the memory states "0," "1," "2," and "3" may be assigned bit values "11," "01," "00," and "10" respectively. In such an example, the 2-bit data may be read from the memory by sensing in a "full-sequence" mode where the two bits are sensed together by sensing relative to the corresponding read demarcation threshold voltages rV1, rV2, and rV3 in three sub-passes respectively.

In FIGS. 4A-4B and 5 and the foregoing corresponding discussion, there is generally described a two-dimensional (or planar) memory array 210 (lying in a x-y plane, for example), which may comprise NAND-type memory cells. However, in an alternative configuration, a memory array may be in the form of a three-dimensional array that, unlike being formed on a planar surface of a semiconductor wafer, the array extends upwards from the wafer surface and comprises stacks or columns of memory cells extending vertically in an upwards direction (for example, in a z direction that is perpendicular to the x-y plane). For example, in FIG. 7 there is depicted an exemplary embodiment of a NAND-type string 701, which is operated in a similar manner as a planar two-dimensional NAND-type string (such as the NAND-type string 50 described above). In this configuration, a memory cell is formed at the juncture of a vertical bit line (see e.g., local bit line 703) and a word line (see e.g., word lines WL0, WL1, etc.), wherein a charge trapping layer located between the local bit line 703 and an intersecting word line stores charge (which dictates the threshold voltage of the transistor formed by the word line—gate—coupled to the vertical bit line—channel—that it encircles). To form such a vertical string 701, stacks of word lines are formed and memory holes are etched at the appropriate locations where cells are to be formed, wherein each memory hole is lined with a charge trapping layer and filled with a suitable local bit line/channel material. Dielectric layers are included for the necessary isolation. Further, located at either end of the NAND-type string 701 are select gates 705, 707, which allow for the selective connection to, or isolation from, external elements 709, 711 that include, for example, conductive lines such as common source lines or bit lines that serve large numbers of strings 701 of an array. In the particular embodiment shown in FIG. 7, the vertical NAND-type string 701 has 32 memory cells (i.e., at the juncture between local bit line 703 and word lines 0 through 31) connected in series. However, a NAND-type string 701 may comprise any suitable number of memory cells.

Figures 7, 8:
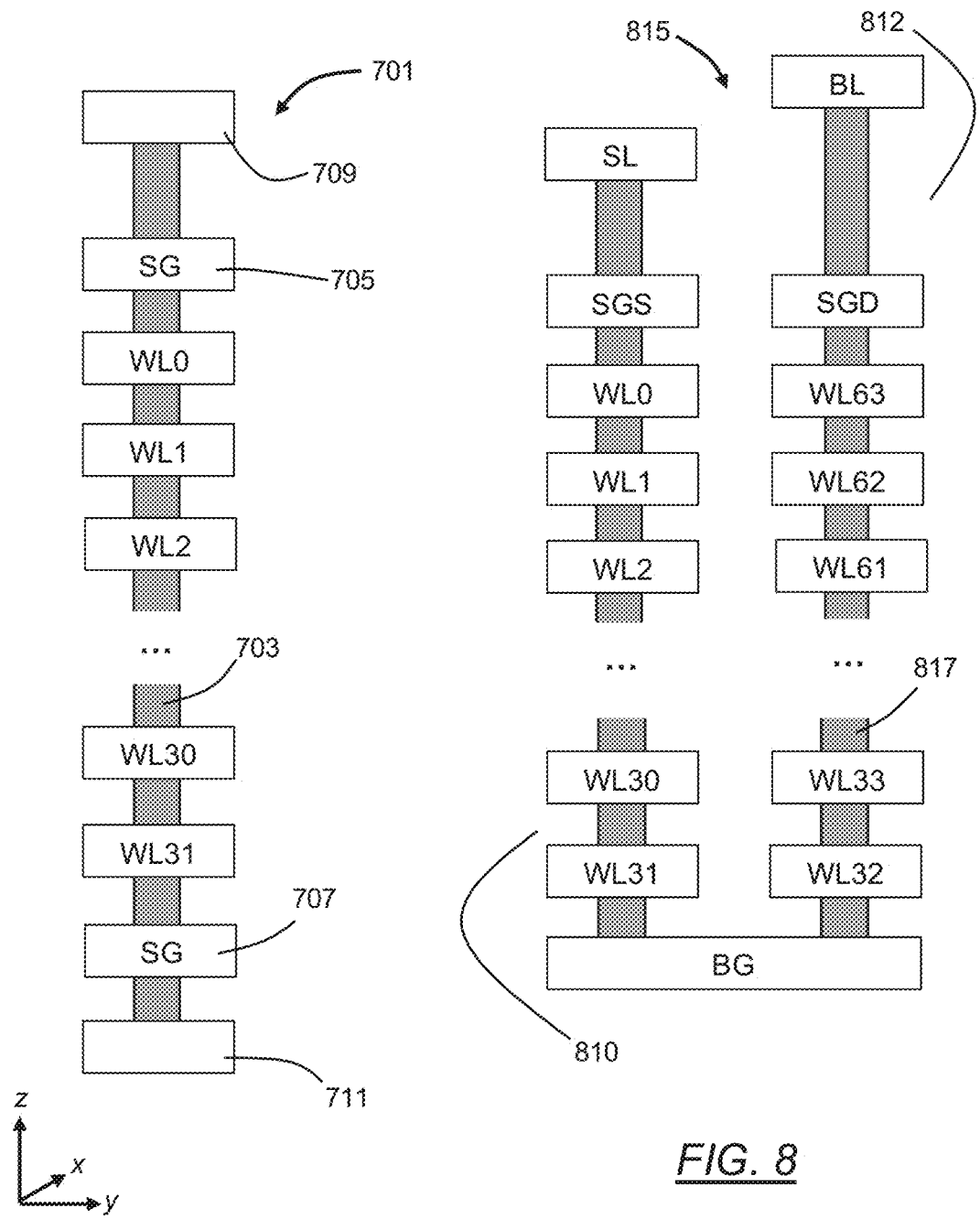
FIG. 7 depicts a vertical NAND-type string in accordance with an exemplary embodiment.
FIG. 8 depicts a vertical NAND-type string in accordance with another exemplary embodiment.

FIG. 8 depicts a second exemplary embodiment of a vertical NAND-type string 815 architecture that is suitable for use in a three-dimensional memory array. In this configuration, string 815 has a U-shape having 64 memory cells formed where the word lines WL0 through WL63 intersect a vertical local bit line 817. At a top end thereof, the NAND-type string 815 is connected to external elements such as a source line (SL) and bit line (BL). Also, at the bottom end of the NAND-type string 815 is a controllable gate (i.e., back gate BG) connecting the two adjacent sides 810, 812. In addition, select gates SGS, SGD are positioned at the ends of the NAND-type string 815 and control the selective connection and isolation thereof.

Figure 9A:
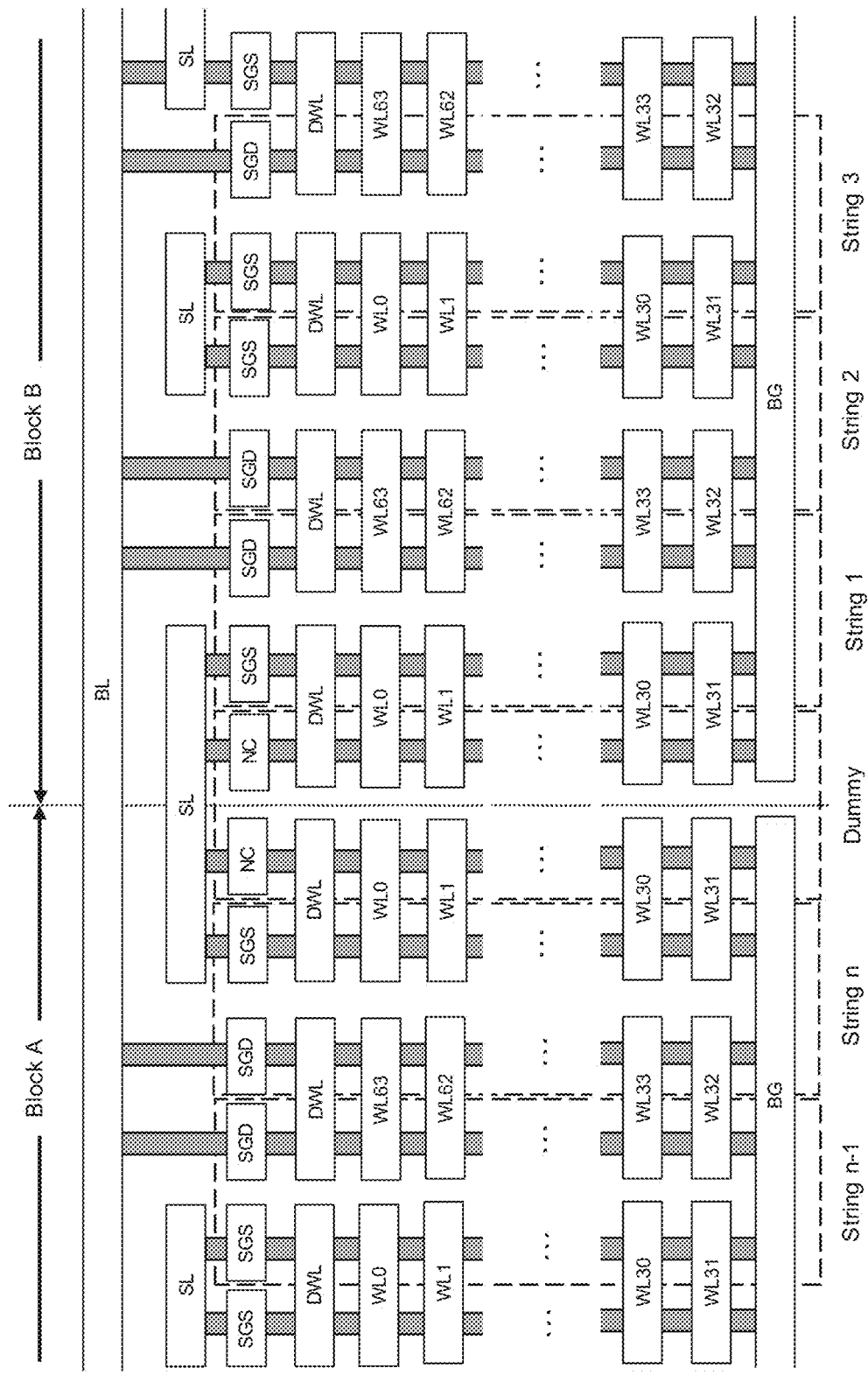
FIG. 9A depicts a cross-sectional view of a three-dimensional NAND-type memory device, in accordance with exemplary embodiments.

Illustrated in FIG. 9A is a cross-sectional view of an exemplary embodiment of one segment of a three-dimensional memory structure comprised of vertical U-shaped NAND-type strings that are similar to the string embodiment depicted in FIG. 8. In this example, a Block A and a Block B of the vertical U-shaped NAND-type strings are pictured. Each of Block A and Block B is connected to a bit line BL and contains an "n" number of strings, only a portion of which are shown in FIG. 9A. In addition, multiple bit lines and word lines serve the memory structure and, with respect to the orientation defined in FIG. 9A, the bit lines extend along the y-direction and the word lines extend along the x-direction to connect the sets of strings to the different bit lines. Further, the select lines SGS, SGD extend in the x direction, thereby allowing for the selective connection or isolation of a set of strings as a collective unit. In this particular embodiment, the word lines are formed such that a single conductive strip forms a word line of two neighboring strings (see e.g., in Block B, word lines WL63, WL62, WL33, WL32, etc., of adjacent Strings 1 and 2 are formed by the same conductive strips). Importantly, the select lines SGS, SGD are not shared amongst the strings. In this way, each set of strings in a block may be separately selected even if a selected set of strings contains word lines that are not separately controllable from word lines in unselected strings. Also depicted in FIG. 9A are dummy word lines DWL that separate the select lines SGS, SDS from the host data word lines WL0-WL63, wherein host data word lines are used for the storage of host data (i.e., data sent to the memory device from an external, or host, source) and dummy word lines are not used for the storage of host data. Rather, a dummy word line may not be used for the storage of anything, or it may be used to store data that regulates the condition of dummy memory cells. Such dummy data may include, but is not limited to, data that puts the threshold voltage of a dummy cell at a level that makes accessing other cells easier or reduces the risk of disturbance. Accordingly, dummy word lines may provide a buffer of protection against the risk of disturbance of host data due to, for example, the proximity of a word line to the select gate. By making the word line closest to a select gate a dummy word line, the risk of disturbing the host data is substantially reduced. Dummy word lines may be located in a number of suitable locations within a memory string configuration (e.g., between host data word lines and a back gate BG) and FIG. 9A depicts just one non-limiting example. Generally, a dummy word line has the same physical structure as a host data word line. Therefore, the number and location of dummy word lines can be suitably configured for any given memory array. For example, in the embodiment depicted in FIG. 9A, half a string of dummy cells is provided in each of Block A and Block B where the two Blocks meet such that the host data word lines of the two Blocks are not immediately adjacent to one another. Further in this example, where the neighboring Block A and Block B meet, there are dummy select lines, which are not connected to any control circuit and are thereby denoted as "NC." Accordingly, different arrangements of dummy word lines or cells, and other dummy structures between blocks and strings are possible according to memory design and operating requirements.

Figure 9B:
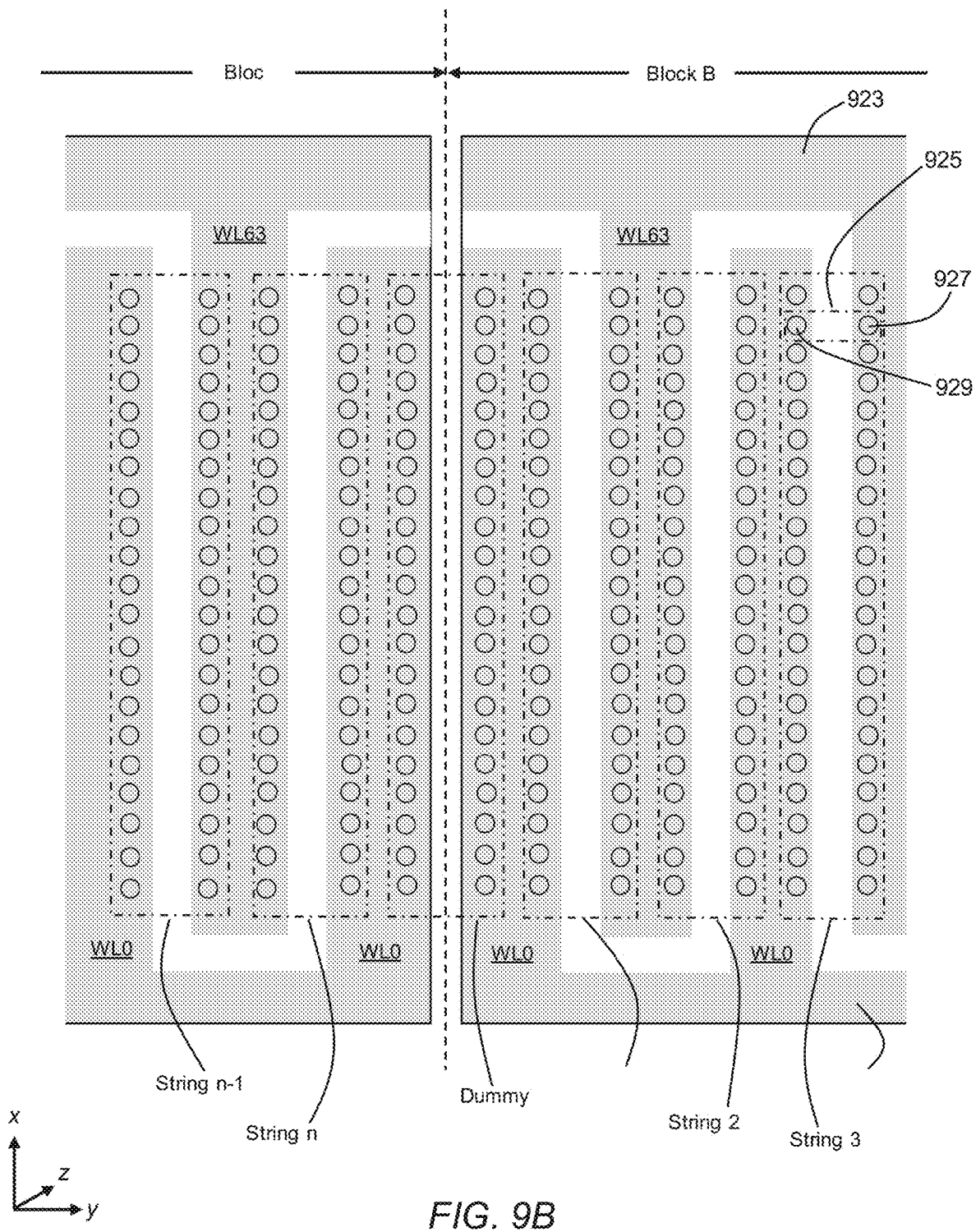
FIG. 9B depicts a cross-sectional view of the three-dimensional NAND-type memory device of FIG. 9A along an axis that is perpendicular to the axis of the cross-sectional view depicted in FIG. 9A.

FIG. 9B illustrates another cross-sectional view of the three-dimensional memory structure of FIG. 9A, pictured along the x-y plane that is perpendicular to and intersects the word lines WL0 and WL63. Accordingly, as can be clearly seen from this vantage point, word lines shared between the NAND-type strings in the same memory block are electrically connected together and formed from a single electrically conductive body (see e.g., word lines WL0 and WL63 in FIG. 9B, each word line being formed from a single conductive body 921, 923, respectively). A similar interconnected structure may be found at each cross-sectional level of word lines (e.g., at the level containing word lines WL1 and WL62, at the level containing word lines WL2 and WL61, etc.) However, word lines that are positioned at the same cross-sectional level but are within different blocks are isolated from each other. Accordingly, for example, as can be clearly seen from the vantage point in FIG. 9B, word line WL0 of Block A is separate and electrically isolated from word line WL0 of Block B and, similarly, word line WL63 of Block A is separate and electrically isolated from word WL63 in Block B (and so on). The memory holes referred to above with respect to FIG. 9A are depicted as circular elements in FIG. 9B. Each memory hole is cylindrical in shape and extends in the z-direction. Therefore, based upon the orientation defined in FIG. 9B, a U-shaped NAND-type string extends along two neighboring, opposing memory holes wherein each memory hole passes through a different conductive body (see e.g., string 925 in FIG. 9B having memory holes denoted as 927, 929 and passing through conductive bodies 923 and 921, respectively).

Further, in a three-dimensional memory array, a set of strings may be defined as all strings that share the same select lines. Accordingly, from the perspective in FIG. 9B, a set of strings consists of all strings that are aligned in the x-direction and share the same select lines. Hence, in FIG. 9B for example, the set of strings containing string 925 is indicated as "String 3" in Block B. Therefore, in operation, when a given set of strings within a block is selected, a selected word line (or a portion of a word line, i.e., a subset of the bit lines that intersect the word line) may be read by applying the appropriate word line voltages to the selected word line and to unselected word lines. As such, word line drivers are connected to supply these appropriate voltages to the connected word lines of a block (e.g., to conductive bodies 923 and 921 in FIG. 9B). Furthermore, select line drivers are connected to supply appropriate voltages to the select lines so that a particular set of strings in a block is selected.

Figure 10:
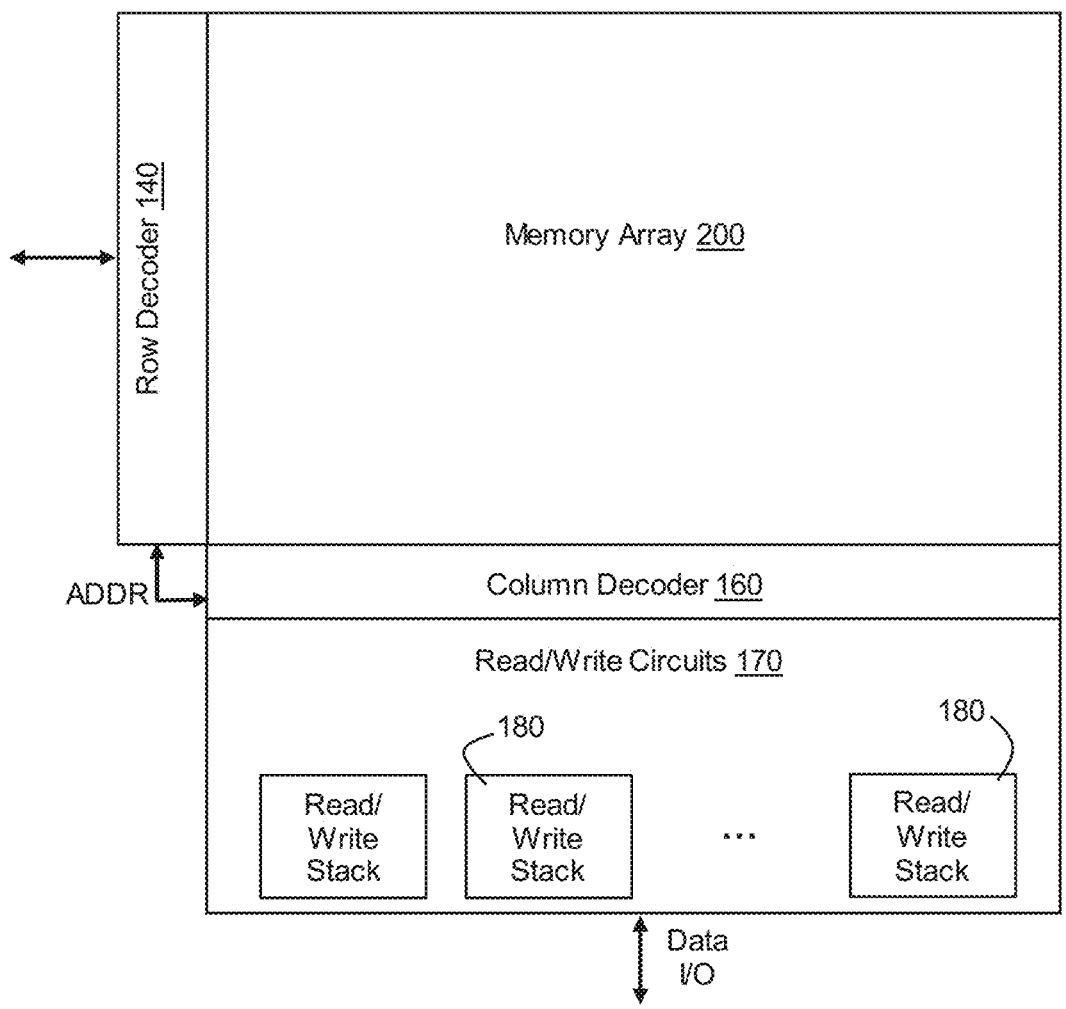
FIG. 10 schematically depicts a configuration of a non-volatile memory array that is accessible by read/write circuits via row and column decoders, in accordance with exemplary embodiments.
Figure 11:
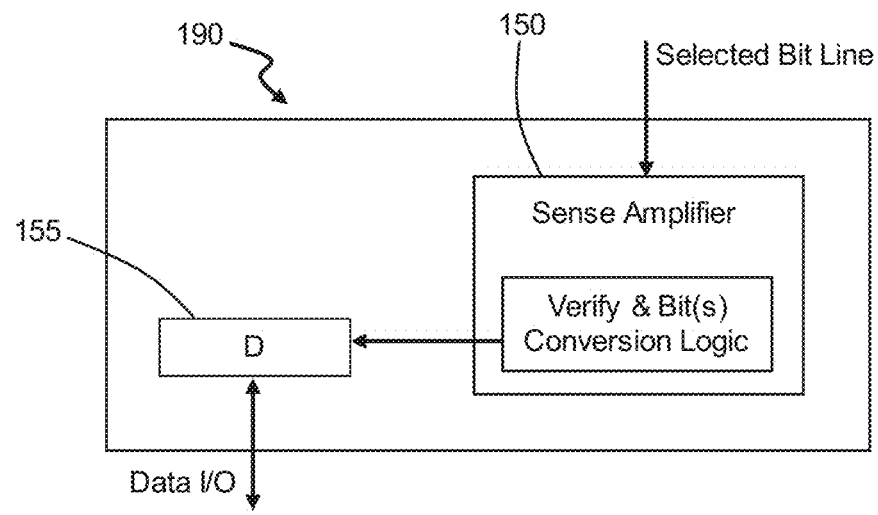
FIG. 11 is a block diagram of an individual read/write module, in accordance with an exemplary embodiment.

Referring back to the overall architecture of a memory system that is, for example, depicted in FIG. 1, a schematic depiction of a typical arrangement of a memory array of such a system is illustrated in FIG. 10. In this exemplary embodiment, there is shown a non-volatile memory array 200 that is accessible by read/write circuits 170 by way of row decoder 140 and column decoder 160. As previously described above, individual memory cells of the memory array 200 are addressable via a set of selected word line(s) and bit line(s). Accordingly, the row decoder 140 selects one or more word lines and the column decoder 160 selects one or more bit lines in order to apply the appropriate voltages to the respective gates of the addressed memory cells. Further, read/write circuits 170 are provided to read or write the memory states of the addressed memory cells, wherein the read/write circuits 170 comprise a number of read/write modules connectable via bit lines to the memory elements of the array 200. A schematic block diagram of such a read/write module 190 is provided in FIG. 11, according to an exemplary embodiment thereof. In operation, during a read or verify step, a sense amplifier 150 determines the current that is flowing through the drain of an addressed memory cell that is connected via a selected bit line. The level detected by the sense amplifier 150 is converted by a level-to-bits conversion logic to a set of data bits to be stored in a data latch 155. Now referring back to FIG. 10, read/ write circuits 170 are organized into banks of read/write stacks 180 wherein each read/write stack 180 is a stack of read/write modules 190.

Figure 12A:
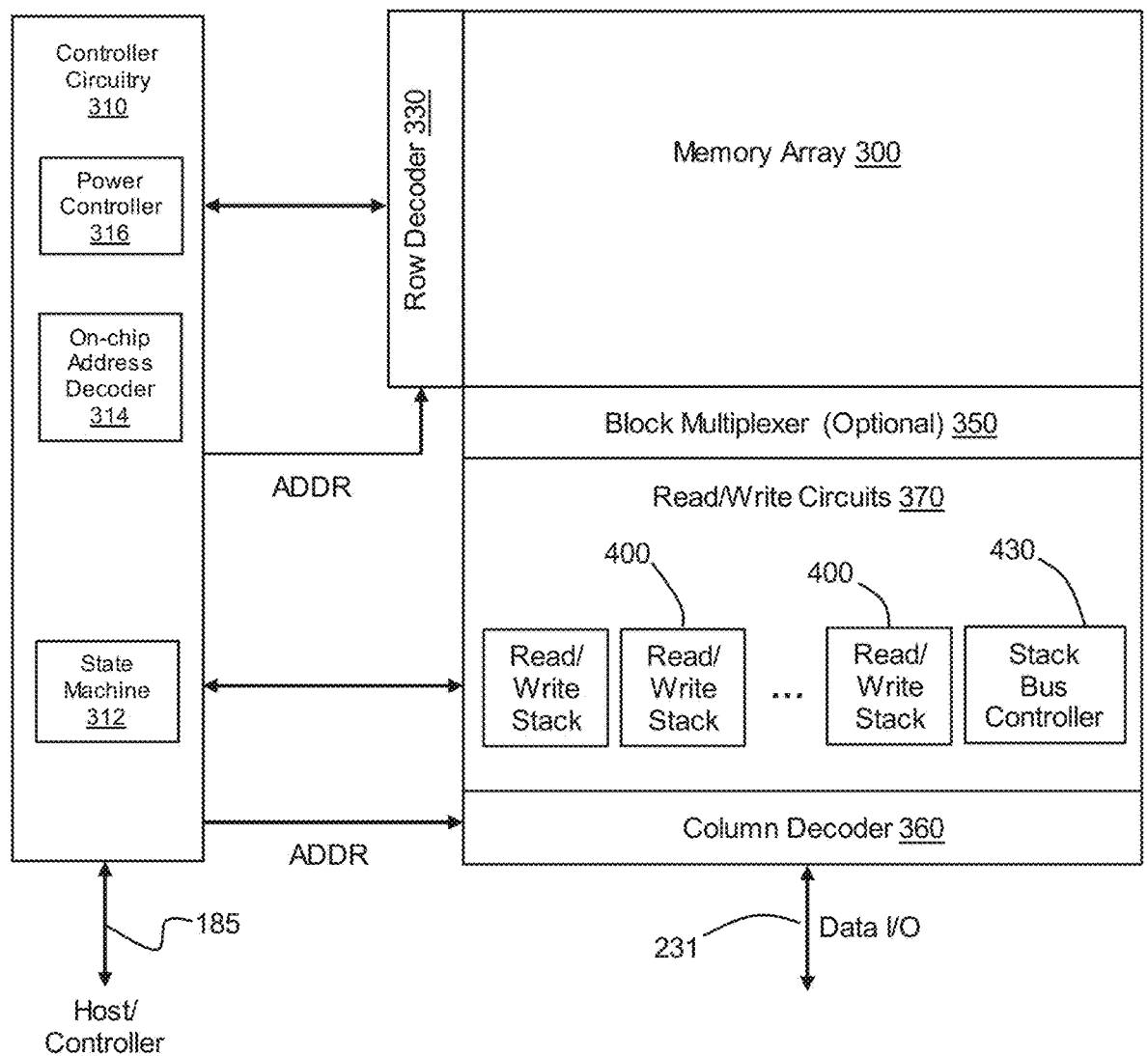
FIG. 12A schematically depicts a memory device with a bank of partitioned read/write stacks, in accordance with exemplary embodiments.

Referring now to FIG. 12A, there is shown an exemplary embodiment of a memory device (such as memory device 102 in FIG. 1, for example) comprised of a non-volatile memory array 300 (which may include NAND-type SLC, MLC, and/or TLC cells in a two- or three-dimensional configuration), control circuitry 310, and read/write circuits 370. Further, as is depicted, read/write circuits 370 are comprised of one or more banks of partitioned read/write stacks 400, thereby allowing a block (or "page") of memory cells to be read or programmed in parallel wherein, according to an exemplary embodiment, a "page" of memory cells constitutes a contiguous row of memory cells. The memory array 300 is addressable by word lines via row decoder 330 and by bit lines via column decoder 360. Alternatively, the memory array 300 may comprise rows of memory cells that are partitioned into multiple blocks or pages. In such an exemplary embodiment, a block multiplexer 350 is provided to multiplex the read/write circuits 370 to the individual blocks.

With respect to the control circuitry 310, it operates in conjunction with the read/write circuits 370 to perform memory operations on the memory array 300. In this particular embodiment, the control circuitry 310 includes a state machine 312, an on-chip address decoder 314, and a power controller 316. The state machine 312 provides chip level control of memory operations. The on-chip decoder 314 provides an address interface between that that is used by the host or a memory controller to the hardware address used by the decoders 330, 360. Lastly, the power controller 316 controls the power and voltages that are supplied to the word lines and bit lines during memory operations.

Figure 12B:
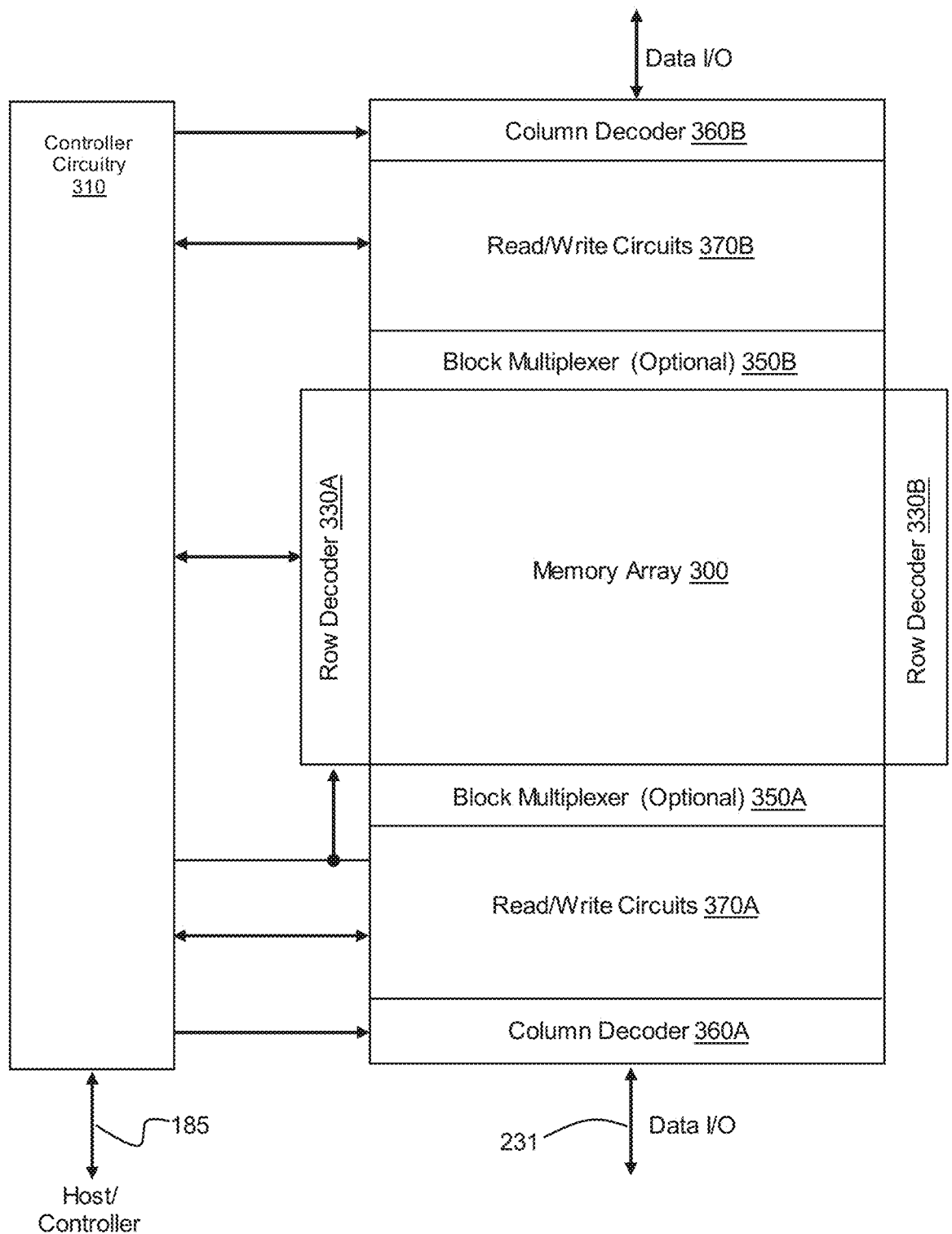
FIG. 12B schematically depicts the memory device of FIG. 12A in a slightly different configuration, in accordance with exemplary embodiments.

FIG. 12B depicts a slightly different exemplary embodiment of the memory device of FIG. 12A. In this particular embodiment, access to memory array 300 by the various peripheral circuits is implemented in a symmetrical manner on opposite sides of the memory array 300. As a result, the access lines and circuitry on each side of the memory array 300 are reduced in half when compared to the configuration in FIG. 12A. Specifically, the row decoder 330 is split into multiple row decoders 330A, 330B, and the column decoder 360 is split into multiple column decoders 360A, 360B. Furthermore, in such an embodiment in which a row of memory cells is partitioned into multiple blocks, block multiplexer 350 is split into multiple block multiplexers 350A, 350B. The read/write circuits 370 are likewise divided into read/write circuits 370A (connecting to bit lines from the bottom of memory array 300) and read/write circuits 370B (connecting to bit lines from the top of memory array 300). Accordingly, the density of the read/write modules (as well as the partitioned read/write stacks 400) is, in essence, reduced by half.

Figure 13:
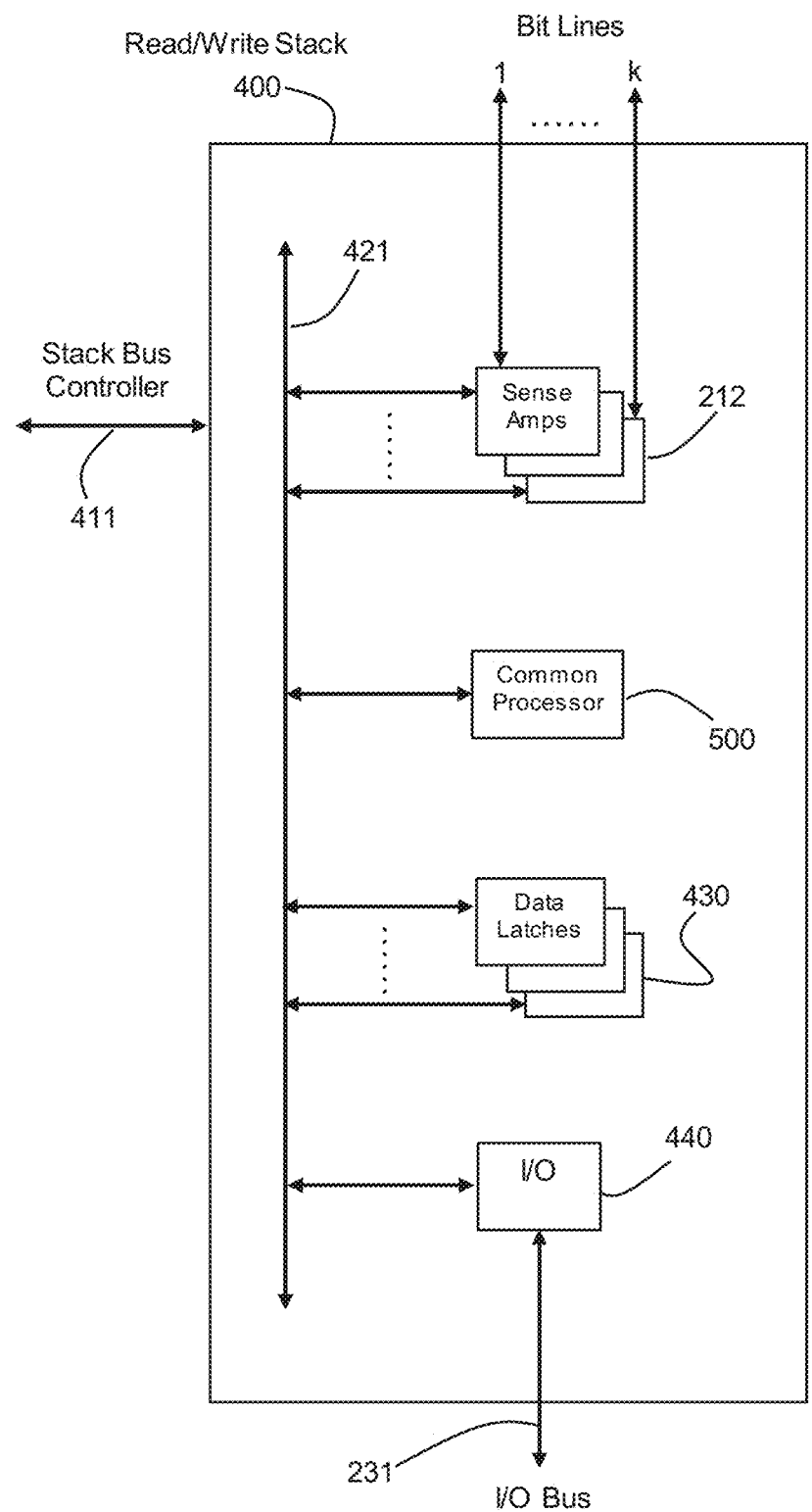
FIG. 13 schematically depicts various components of a read/write stack, such as the read/write stacks depicted in FIG. 12A, in accordance with exemplary embodiments.
Figure 14A:
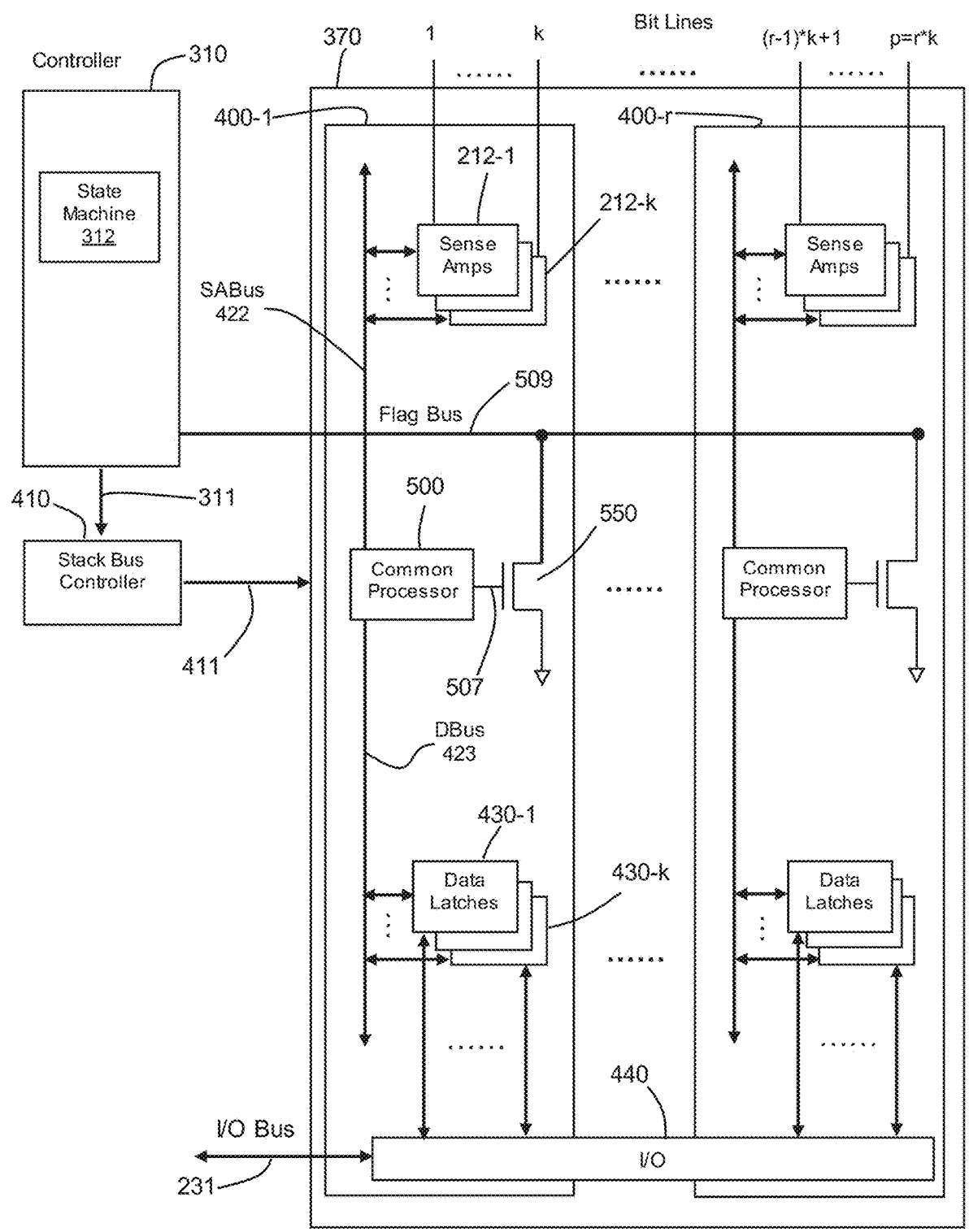
FIG. 14A schematically depicts a plurality of read/write stacks arranged amongst read/write circuits of a memory device, such as the memory device depicted in FIG. 12A, in accordance with exemplary embodiments.

Referring now to FIG. 13, there is illustrated an exemplary embodiment of certain components in a read/write stack, such as the read/write stacks 400 of FIG. 12A. According to this particular architecture, a read/write stack 400 comprises a stack of sense amplifiers 212 for sensing a "k" number of bit lines, an I/O module 440 for input or output of data over an I/O bus 231, a stack of data latches 430 for storing input and/or output data, a common processor 500 to process and store data among the read/write stack 400, and a stack bus 421 for communication among the read/write stack 400 components. In addition, a stack bus controller provides control and timing signals via lines 411 for controlling the various components of read/write stack 400. FIG. 14A depicts an exemplary embodiment for incorporating the read/write stack 400 of the embodiment in FIG. 13 amongst the read/write circuits 370 of the memory devices depicted in FIGS. 12A-12B. As indicated above, each of read/write stacks 400 operates on a group of "k" number bit lines in parallel. Therefore, if a page in memory array 300 has p=r*k bit lines, there will be a "r" number of read/write stacks—i.e., read/write stacks 400-1, . . . , 400-r. Accordingly, the entire bank of partitioned read/write stacks 400-1, . . . , 400-r, operating in parallel allows a block (or a page) of p cells along a row to be read or programmed in parallel, there being p read/write modules for the entire row of cells. As each read/write stack 400-1, . . . , 400-r serves "k" memory cells, the total number of read/write stacks in a bank may be expressed as r=p/k. Further, in accordance with this example, each read/write stack correspondingly has a stack of sense amplifiers 212-1, . . . , 212-k that serves a segment of "k" memory cells in parallel. In addition, each read/write stack correspondingly has a stack of data latches 430-1, . . . , 430-k, wherein each data latch is associated with a memory cell. As such, there is an I/O module 440 enabling data latches 430-1, . . . , 430-k to exchange data externally via an I/O bus 231.

Still referring to FIG. 14A, there is also shown a stack bus controller 410 that receives signals from the memory controller 310 (via lines 311) and in turn provides control and timing signals to the read/write circuits 370 via lines 411. Communication among the read/write stacks 400 is implemented by an interconnecting stack bus controlled by stack bus controller 410. Therefore, the control lines 411 provide control and clock signals from the stack bus controller 410 to the components of the read/write stacks 400-1, . . . , 400-r. In this particular example, the interconnecting stack bus is divided into a SABus 422 and a DBus 423, wherein SABus 422 provides for communication between the common processor 500 and the stack sense amplifiers 212-1, . . . , 212-k, and the DBus 423 provides a communication pathway between the common processor 500 and the stack of data latches 430-1, . . . , 430-k. With respect to the common processor 500, it further comprises an output 507 for output of a status signal of a memory operation, such as an error condition. As is depicted in FIG. 14A, this status signal may, for example, be used to drive a gate of a n-transistor 550 that is tied to a Flag Bus 509 in a Wired-Or configuration, wherein the Flag Bus 509 is pre-charged by the controller 310 and is pulled down when a status signal is asserted by any of read/write stacks 400-1, . . . , 400-r.

Figure 14B:
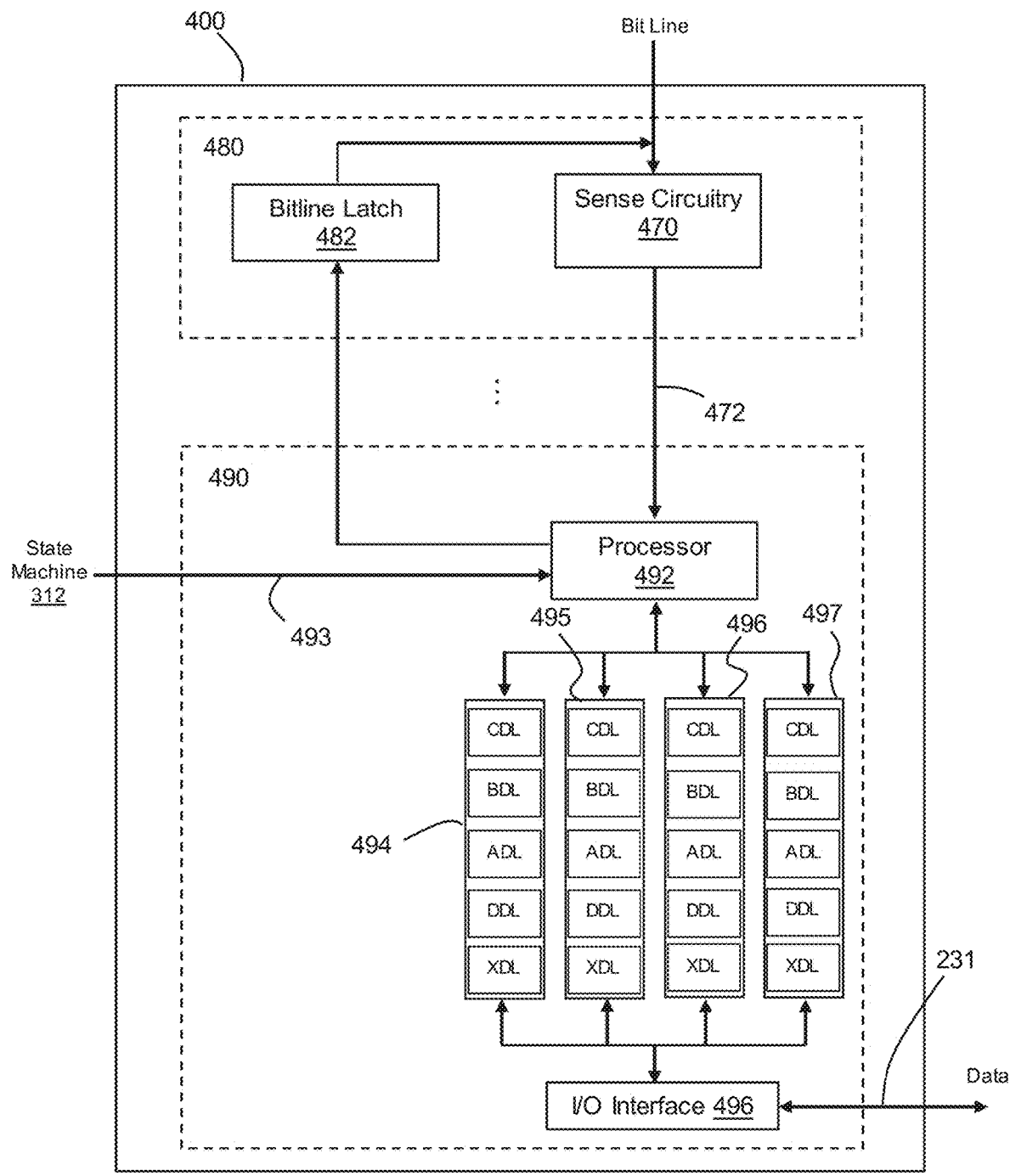
FIG. 14B is a block diagram depicted a sense block of a read/write stack, such as the read/write stacks depicted in FIG. 12A, in accordance with exemplary embodiments.

Further, an exemplary embodiment of an individual sense block (as encompassed by a read/write stack 400) is depicted in FIG. 14B. Sense block 400 is partitioned into one or more core portions comprising the sense modules 480 or sense amplifiers, and a common portion, referred to as a managing circuit 490. In one embodiment, there is a separate sense module 480 for each bit line and one common managing circuit 490 for a set of multiple, e.g., four or eight, sense modules 480. Each of the sense modules in a group communicates with the associated managing circuit via data bus 472. Thus, there are one or more managing circuits which communicate with the sense modules of a set of storage elements 10.

Sense module 480 comprises sense circuitry 470 that performs sensing by determining whether a conduction current in a connected bit line is above or below a predetermined threshold level. Sense module 480 also includes a bit line latch 482 that is used to set a voltage condition on the connected bit line. For example, a predetermined state latched in bit line latch 482 will result in the connected bit line being pulled to a state designating program inhibit (e.g., 1.5-3 V). As an example, a flag=0 can inhibit programming, while flag=1 does not inhibit programming.

In the exemplary embodiment of FIG. 14B, the managing circuit 490 comprises a processor 492, four example sets of data latches 494, 495, 496, and 497, and an I/O interface 496 coupled between the sets of data latches 494-497 and the data bus 231. One set of data latches may be provided for each sense module 480, and data latches identified by XDL, DDL, ADL, BDL, and CDL may be provided for each set. In some cases, additional data latches may be used. In one exemplary approach, in a memory device which uses eight data states, XDL stores user data, DDL stores an indication of whether quick pass write programming is used, ADL stores a lower page of data, BDL stores a middle page of data, and CDL stores an upper page of data.

Processor 492 performs computations, such as to determine the data stored in the sensed storage element and store the determined data in the set of data latches. Each set of data latches 494-497 is used to store data bits determined by processor 492 during a read operation, and to store data bits imported from the data bus 231 during a programming operation which represent write data meant to be programmed into the memory. The I/O interface 496 provides an interface between data latches 494-497 and the data bus 231.

During reading, the operation of the system is under the control of state machine 312 that controls the supply of different control gate voltages to the addressed storage element 10. As it steps through the various predefined control gate voltages corresponding to the various memory states supported by the memory, the sense module 480 may trip at one of these voltages and a corresponding output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494-497. In another embodiment of the managing circuit 490, the bit line latch 482 serves double duty, both as a latch for latching the output of the sense module 480 and also as a bit line latch as described above.

During program or verify operations, the data to be programmed (write data) is stored in the set of data latches 494-497 from the data bus 231. The programming operation, under the control of the state machine 312, comprises a series of programming voltage pulses applied to the control gates of the addressed storage elements. Each program pulse is followed by a read back (verify) to determine if the storage element has been programmed to the desired memory state. In some cases, processor 492 monitors the read back memory state relative to the desired memory state. When the two are in agreement, the processor 492 proceeds to set the bit line latch 482 to cause the bit line to be pulled to a state designating program inhibit. This inhibits the storage element coupled to the bit line from further programming even if program pulses appear on its control gate. In other embodiments, the processor initially loads the bit line latch 482 and the sense circuitry sets it to an inhibit value during the verify process.

Each set of data latches 494-497 may be implemented as a stack of data latches for each sense module. In one exemplary embodiment, there are three data latches per sense module 480. In some implementations, the data latches are implemented as a shift register so that the parallel data stored therein is converted to serial data for data bus 231, and vice versa. For example, all data latches corresponding to the read/write block of M storage elements can be linked together to form a block shift register so that a block of data can be input or output by serial transfer. In particular, the bank of read/write modules is adapted such that each of its set of data latches will shift data into or out of the data bus in sequence as if they are part of a shift register for the entire read/write block.

The data latches identify when an associated storage element 10 has reached certain mileposts in a programming operation. For example, latches may identify if a storage element's Vth is below a particular verify level. Data latches indicate whether a storage element currently stores one or more bits from a page of data. For example, the ADL latch is flipped (e.g., from 0 to 1) when a lower page bit is stored in an associated storage element. Further, the BDL latch is flipped when a middle page bit is stored in an associated storage element. And the CDL latch is flipped when an upper page bit is stored in an associated storage element. A bit is stored in a storage element when the Vth exceeds an associated verify level.

Figure 15:
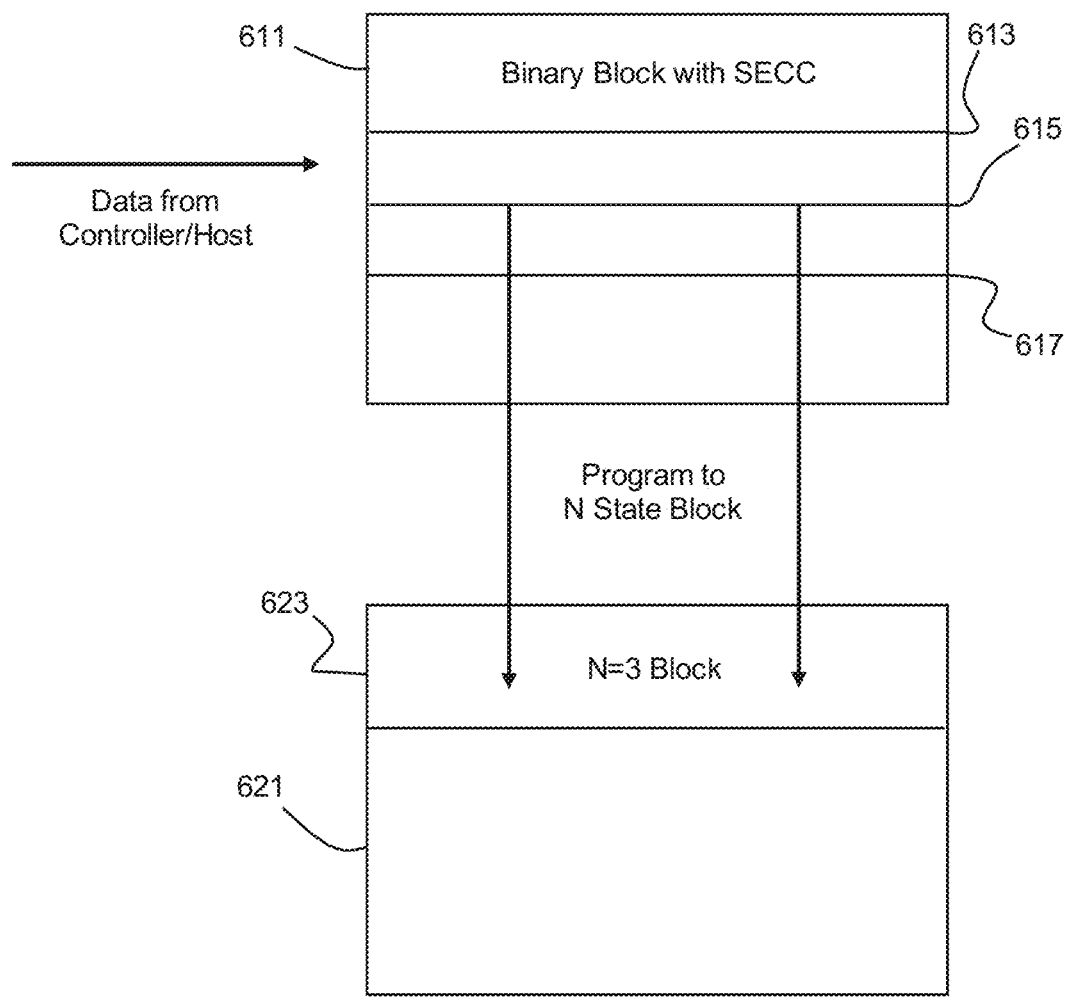
FIG. 15 illustrates an on-memory folding process in which the data from multiple word lines in a binary format is rewritten into a multi-state format, in accordance with exemplary embodiments.
Figure 16:
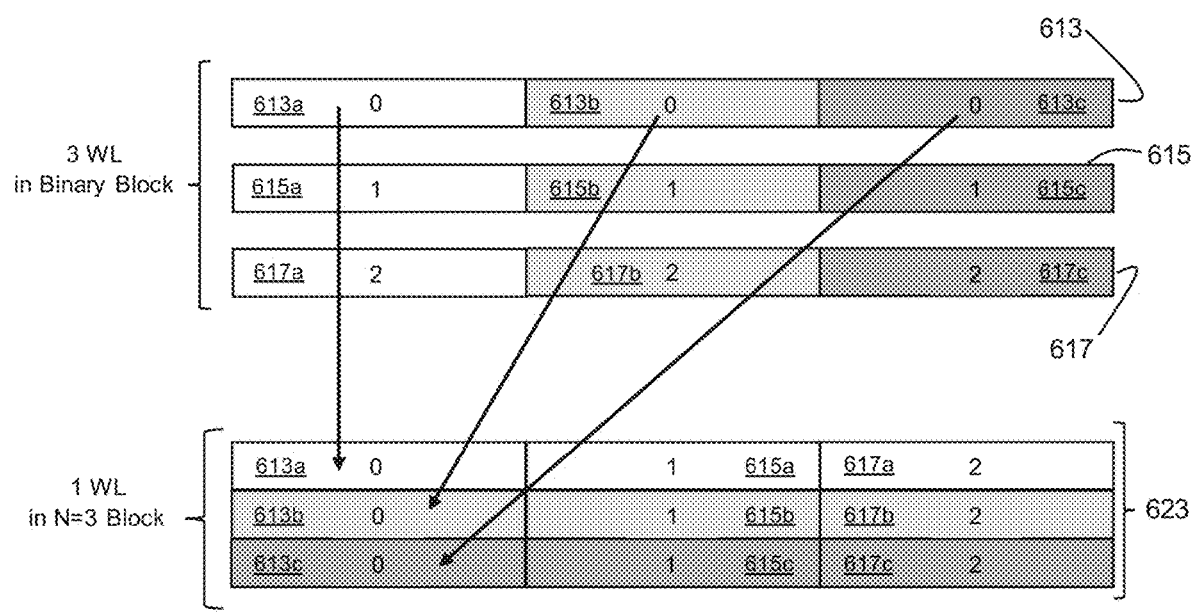
FIG. 16 illustrates aspects of the folding process of FIG. 15 in greater detail, in accordance with exemplary embodiments.

The above discussion describes just several non-limiting embodiments of non-volatile memory systems and devices. Any of these systems and devices, as well as other exemplary embodiments, can, as previously mentioned, operate in both binary forms (SLC) and multi-state or multi-level (MLC or TLC) forms. For example, as data can be written or programmed faster and with less critical tolerances (i.e., with greater reliability) in binary form in comparison to a multi-state form, a memory device may be configured to initially program data in binary form as it is being received from a host and then at a subsequent time, rewrite the data in a multi-state format to take advantage of the greater storage density. Therefore, in these types of memory devices, some memory cells may be used in a single-state form and other memory cells may be used in a multi-state form, or the same cells may be operated to store differing numbers of bits. The process for rewriting data from a binary format into a multi-state format is referred to as "folding." According to an exemplary embodiment of a folding process, data is initially transferred from the memory controller (e.g., controller 310) to the memory, written along word lines of the memory array (e.g., array 300) in a binary format. Thereafter, the data is read into registers associated with the memory array, where the data is rearranged in order that it may be written back into the memory array in a multi-state form. For example, in a multi-state form of three bits per cell, the content of three word lines would each be read into the corresponding registers, rearranged to correspond to the three bits that will be stored in each cell, and rewritten back to a single word line of the memory array in a three-bit per cell format. This scenario is illustrated in FIG. 15. As indicated, data is received from a controller or host and is initially programmed in binary format (SLC) along an "N" number of word lines of a representative memory block 611. Subsequently, the content of the "N" word lines is rewritten in a multi-state (MLC) "N"-bit per cell format along a single word line of another representative memory block 621, wherein this "folding" process is accomplished on the memory itself. In this particular example, three word lines 613, 615, 617 of the binary formatted block 611 undergo the folding process and are rewritten along a single word line 623 of the multi-state 3-bit per cell formatted block 621 (i.e., N=3). Block 611 may be specifically assigned to operate in only binary mode or may be a block operable in MLC mode by, for example, having just the lowest page of multiple logical pages be storable on a physical page. Similarly, block 621 may be assigned for only the multi-state operation or may be operable in binary mode as well. FIG. 16 depicts an exemplary embodiment of the rearrangement and rewriting of data in the example folding process that is shown in FIG. 15, wherein the three binary word lines in binary format are folded into a single multi-state word line. Accordingly, at the top of FIG. 16 are the three binary state word lines 613, 615, and 617, wherein each word line is divided into, for example, three parts a, b, and c, each segment containing a third of the memory cells along the corresponding a third of the bit lines (here taken as contiguous). Further, at the bottom of FIG. 16 is the multi-state word line 623 in which the three parts 613a-c of the first word line 613 are folded and written into a first third of word line 623, the three parts 615a-c of the second word line 615 are folded and written into a second third of word line 623, and the three parts 617a-c of the third word line 617 are folded and written into a final third of word line 623. Importantly, although the embodiments of FIGS. 15 and 16 show the case in which there are three pages of data rewritten from three physical pages into multi-state format on a single physical page, other numbers of storage densities can be used. Additionally, although entire word lines (each here corresponding to a page) are shown, in a memory system that allows partial page operation, partial pages may be used. Finally, although FIG. 16 highlights the case in which memory cells along a word line are divided into segments along contiguous bit lines for folding, other arrangements can be used.

Figure 17:
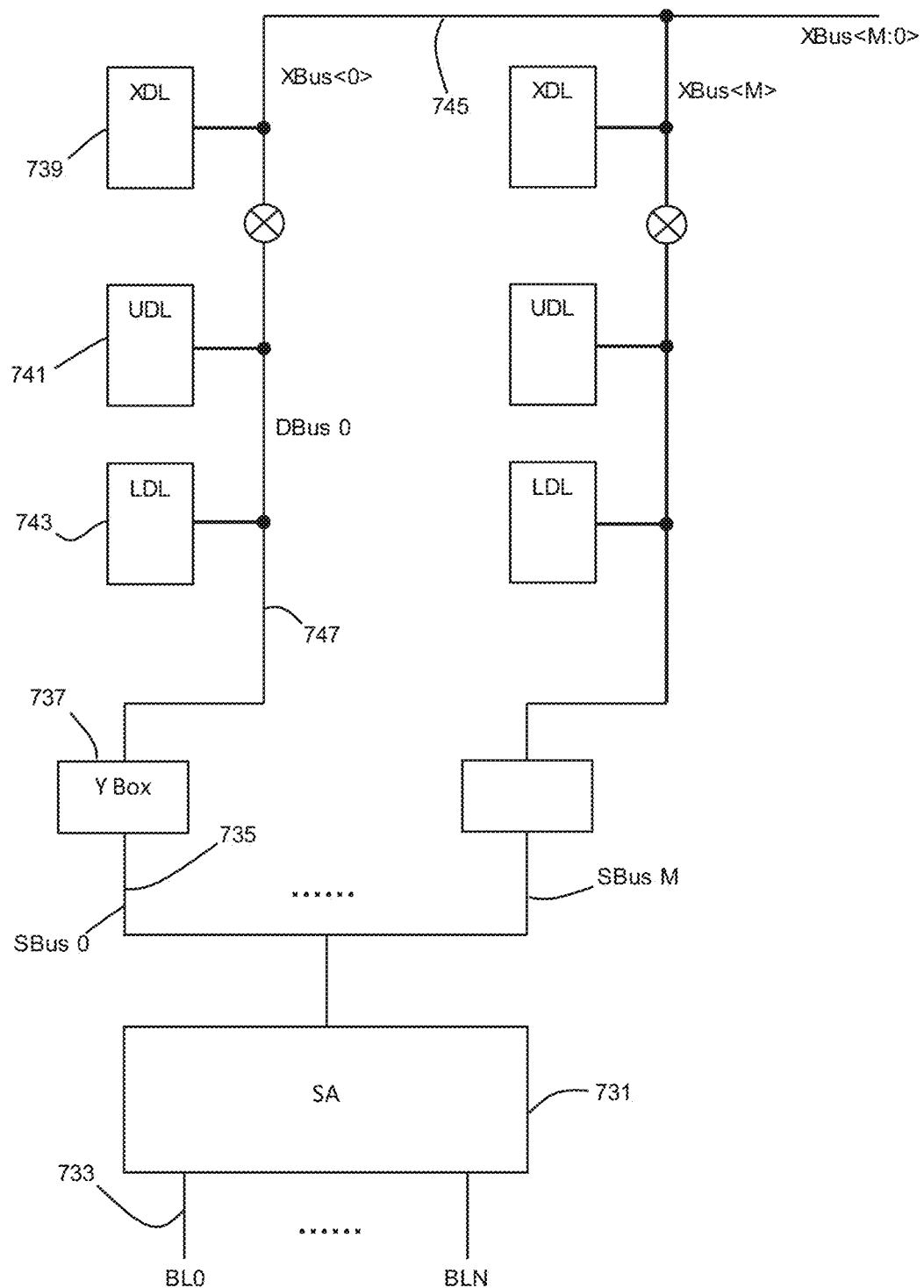
FIG. 17 is a block diagram of a register structure suitable for a SLC to MLC folding operation, in accordance with exemplary embodiments.
Figure 18:
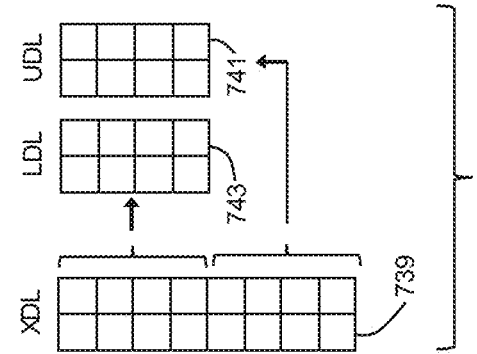
FIGS. 18A-18C is a graphical illustration of a rearrangement of data in a folding operation in a two-bit per cell context, in accordance with exemplary embodiments.

As indicated above, the folding process is performed on the memory itself such that received data from the host does not need to first be transferred off the memory before it can be rewritten into a memory array in the multi-state format. This ability can be implemented by, for example, reading the data of the multiple binary state word lines (e.g., 613, 615, 617) into corresponding registers (or latches) associated with the memory array, rearranged within these registers into the form needed for multi-state programming, and then rewritten into a single word line (e.g., 623) of a multi-state memory block. Accordingly, in the embodiment shown in FIGS. 15 and 16, the binary content of several memory cells (three, specifically) on the same word line, but along different bit lines, are read into the associated data registers or latches, and then rearranged to correspond to the multi-bits of a single cell on a corresponding single bit line from where it can be written. FIG. 17 is a block diagram of an exemplary embodiment of a register structure as incorporated with a read/write stack assembly such as those described above with respect to FIGS. 13 and 14. For an ease in understanding, this particular example pertains to a two-bit per cell context. Further, FIGS. 18A-C illustrate how data may be rearranged during a folding operation to rewrite binary data into a two-bit per cell format using registers (or latches) such as the example register structure depicted in FIG. 17.

As indicated in FIG. 17, a sense amp (SA) 731 is connectable to a plurality of bit lines, BL0, . . . , BLn (see e.g., bit line 733), such that the content of each bit line may be transferred to one of the register stacks along a corresponding stack bus, SBus0, . . . , SBusM (see e.g., SBus0 735), to the processing circuitry that controls the bus. For example, in FIG. 17, there is shown processing circuitry YBOX 737 in association with SBus0 735, in which processing circuitry YBOX 737 subsequently transfers the data along another bus (i.e., DBUS 747) and into a lower bit data latch LDL 743, an upper bit data latch UDL 741, or data latch XDL 739. According to this particular embodiment, data can be transferred between XDL 739 and either of UDL 741 or LDL 743, but data can only be transferred to or from an external bus XBus 745 by the data latch XDL 739. A differing number of bit lines BLn (wherein "n" is a number greater than 1) and a differing number of register stacks SBusM (wherein "M" is a number greater than 1) may be administered by this exemplary structure, and the number "n" may be different than the number "M." Any integer value of "n" and "M" may be used, however, this configuration is primarily constructed for "n" to be some integer multiple of "M" such that each of the registers will have n/M levels for entries in order to store the sense amp results for each of the multiple bit lines assigned to a given set of registers along a stack bus. For example, in the exemplary folding process illustrated in FIGS. 18A-18C, n=64 and M=8 such that the number of tiers (n/M)=8. Accordingly, although various values for "n" and "M" may be used, certain of their respective ratios (based on the number of states used in the multi-state (MLC) storage) are more conducive to the folding process.

As mentioned above, FIGS. 18A-18C provide a conceptual illustration of an example embodiment of how a folding process can be executed within the registers associated with a memory array that comprises both a binary (SLC) block (e.g., block 611 in FIG. 15) and multi-state (MLC) block (e.g., block 621 in FIG. 15). In this specific example, there are eight sets of XDL/UDL/LDL registers (i.e., M=8) wherein, as depicted in FIGS. 18B and 18C, each register has eight tiers (i.e., n/M=8) T0, . . . , T7. As such, the eight columns correspond to the values on each of the sets of XDL/UDL/LDL registers and each row is considered to be a byte wide. Accordingly, FIG. 16A conceptually demonstrates how an N=2 folding is carried out. Once the data is initially read from a word line into the XDL 739 register, half of the rows are transferred into the LDL 743 register and the other half are transferred into the UDL 741 register. In this format and from this location, the data can now be transferred as lower and upper bits along a multi-state word line. As half of the available rows of the UDL and LDL registers are still not filled, the XDL register may be filled again and have its content transferred into the remaining rows of the UDL and LDL registers before programming begins. As the number of rows in the XDL register are in effect split in half, it is beneficial if the XDL register has an even number of tiers. Accordingly, if the data is to be rewritten into an N-bit format, it is advantageous that the number of rows in the XDL register is a multiple of N. For example, for N=3, there could be six or nine rows. Or for N=4, eight rows could be used. Thus, with respect to the folding process, 1/Nth of the rows from the XDL register could then be transferred out to the UDL and LDL registers corresponding to each of the N multi-state bits. It should be noted that the data folding operation from XDL into UDL and LDL can be implemented in different ways. For example, FIG. 18B illustrates an exemplary embodiment of a folding operation in which a first page of binary data is initially read into the XDL register and, thereafter, the byte-sized rows of the even tiers are transferred into the top four rows of the LDL register and, likewise, the odd tiers are transferred into the top four rows of the UDL register. Further, as is continued in FIG. 18C, a second page of data is read from the sense amp into the XDL register and the even and odd tiers are again transferred into the LDL and UDL registers, respectively. The transfer of data off the bit lines into the sense amps can be accomplished by any suitable means such as, for example, various pointer schemes including one in which a pointer traverses all of the bit lines in order. Once the data is folded into the multi-state format registers, it can then be rewritten back into a multi-state block of the memory array.

Figure 19:
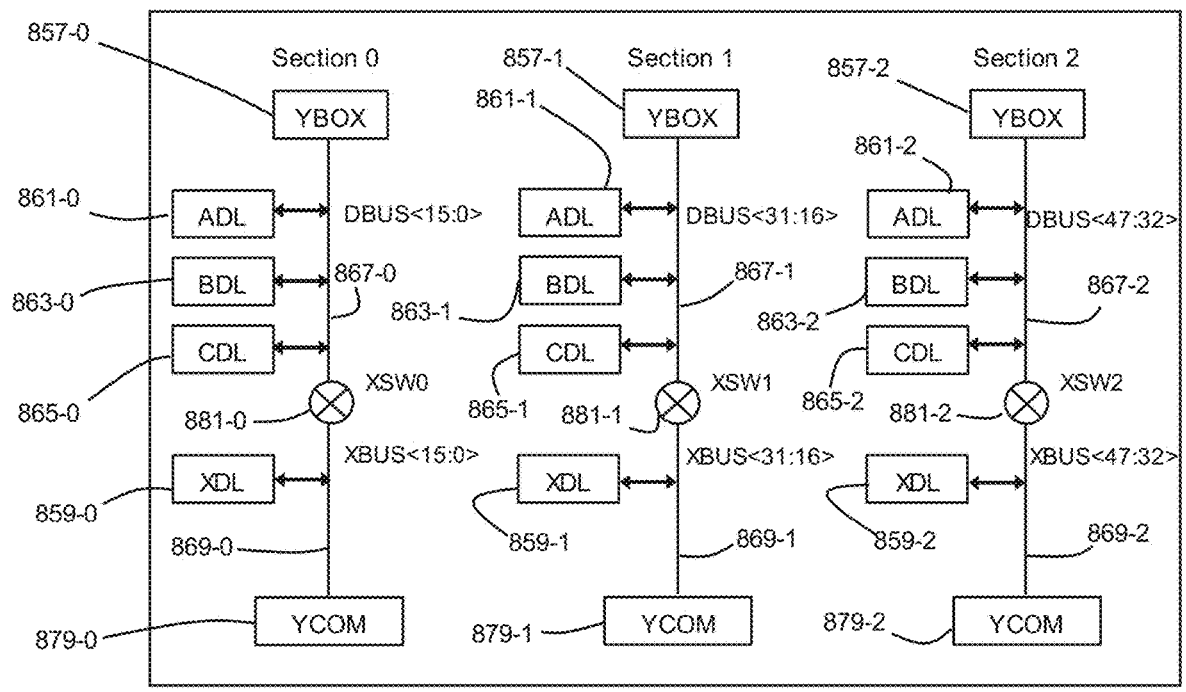
FIG. 19 is a block diagram of the register structure of FIG. 17 expanded for several sections of memory and suitable for a SLC to MLC and/or TLC folding operation, in accordance with exemplary embodiments.
Figure 20:
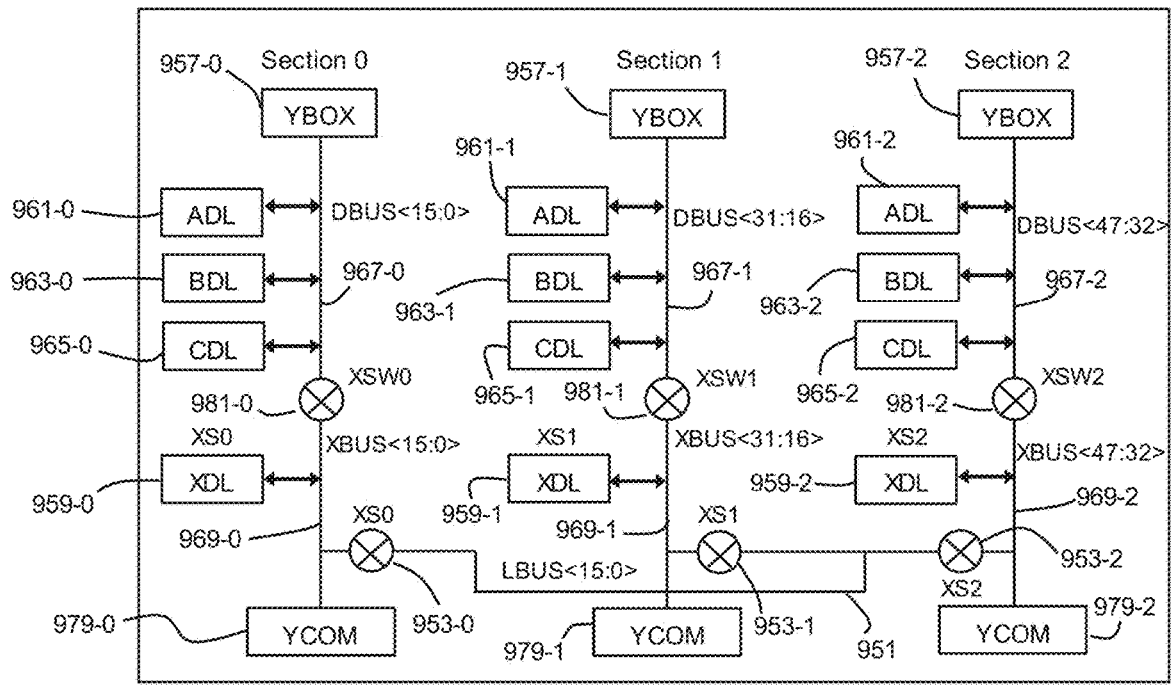
FIG. 20 is a block diagram of the register structure of FIG. 19 with the incorporation of a local data bus between the stack buses for a subset of the bit line sections, in accordance with exemplary embodiments.

Referring now to FIGS. 19 and 20, there is depicted further exemplary embodiments of a register structure that may be utilized with respect to a folding operation that results in data rewriting to multi-state cells storing at least three bits per cell (i.e., TLC-type). Also, as will be explained, these embodiments add a local internal data bus that connects to the SBuses 735 of different register stacks in order that data may also be transferred between the registers of the different stacks. For example, according to an embodiment in which the binary data is read out and then rewritten or programmed back in with three bits per cell, the read/write stacks are split into three groups where the internal stack buses of the stacks in each group are connected by an internal local bus. This type of arrangement is particularly useful when the number of levels or tiers used in the registers is not divisible by the number of MLC states (e.g., for eight tiers and three-bit per cell storage in MLC mode), as was discussed above with respect to FIGS. 17 and 18A-C. In FIG. 19 depicts a plurality of read/write stacks in the case of M=15 wherein, for purposes of explanation, the various elements have been rotated upside down from the layout pictured in FIG. 17, and a sense amplifier (SA) 731 is not explicitly shown. Included is an I/O module YCOM 879 that is connected to an I/O bus (which is also not shown but is depicted in FIGS. 13-14). Importantly, rather than the pair of registers (or latches) UDL 741 and LDL 743 utilized in the embodiments of FIGS. 17 and 18A-C, each of the stacks has three registers (or latches), ADL 861, BDL 863, and CDL 865, in addition to the XDL register 859. Accordingly, these four data latches, or more, are typically found in a three-bit MLC memory design and are connected together through DBus 867 and XBus 869 communication pathways. Bit lines of the memory array may be divided into sections, each section having its own read/write stack. For example, each stack could be responsible for a bit line section of 128 bit lines (such that N=128 with respect to the register structure in FIG. 17). In FIG. 19, just three bit line sections (i.e., Sections 0, 1, and 2) are depicted. However, a memory device will typically comprise a much greater number of bit line sections. As previously discussed, data transfer operations for the memory array are through YBOX 857. The XBus 869 pathway is also connected to YCOM 879 for data I/O operations. Therefore, according to this configuration, data cannot be transferred across the different sections.

Conversely, in the register structed that is depicted in FIG. 20, the same elements that appear in FIG. 19 are repeated but, in addition, there is a local data bus 951 that is incorporated between the stack buses (e.g., XBus 969-0, 969-1, and 969-2) of a subset of the plurality of read/write stacks. As a result, data can now be transferred between the different sections (e.g., Sections 0, 1, and 2) or columns. Thus, the various ways in which data can be rearranged and shuffled within the memory device itself during a folding operation and without the intervention of an external controller are increased. In the exemplary embodiment of FIG. 20, the local data bus 951 is shown as connecting the stack buses of just three read/write stacks. However, as indicated above, this is only a partial illustration and in practice, this arrangement would be repeated through a multitude of subsets of three stacks). Further, in FIG. 20, the local data bus, LBus 951, has a width (here 16 bits) that matches that of the stack buses 969-0, 969-1, 969-2. Signals XSW0, XSW1, and XSW2 are independent control signals, as are XS0 at 953-0, XS1 at 953-1, and XS2 at 953-2, and these signals select how the bus (XBus and LBus) are connected between different sections. Signals XS0, XS1, and XS2 are also independent signals that control which section's XDL register can receive data from the other sections. Thus, by controlling the timing of these signals, data from one section can be transferred into another section. This horizontal transfer ability between the sections combined with the previously described vertical data transfer ability between the registers within a section provides the memory with significant flexibility for data transfer and rearrangement with the latches ADL, BDL, CDL, and XDL in performing a folding operation.

Figure 21:
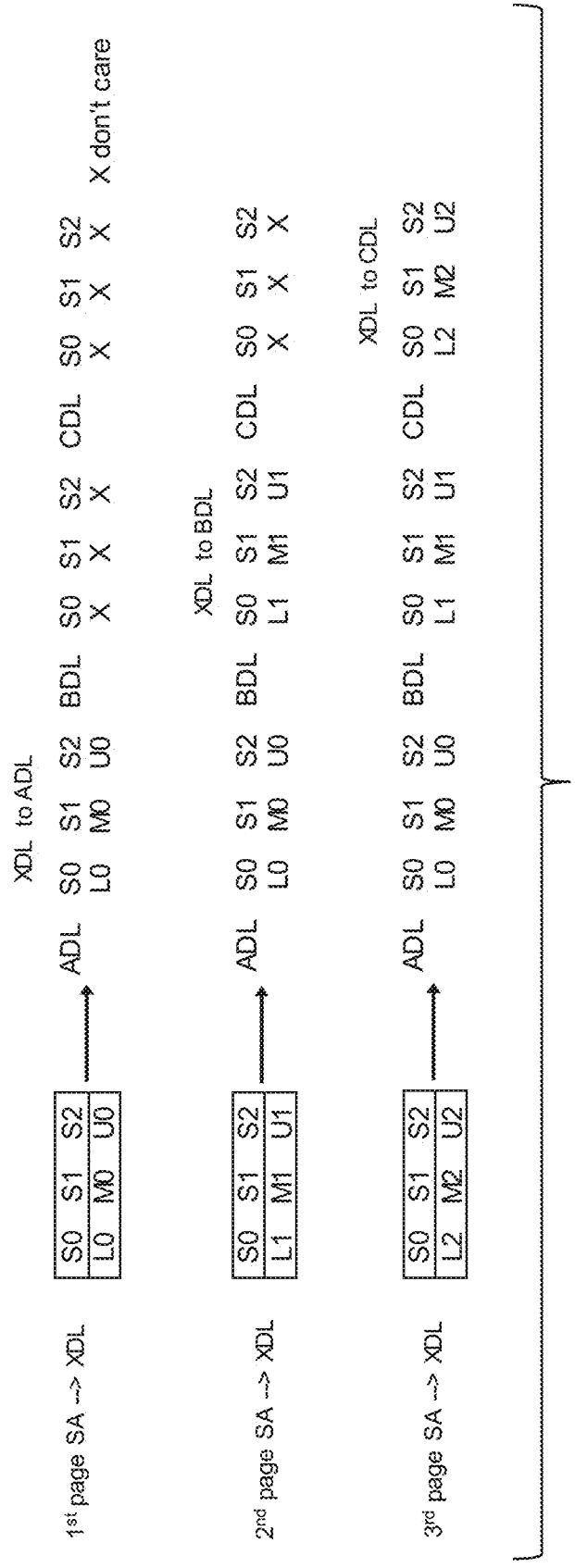
FIG. 21 illustrates a read process for a plurality of binary mode pages with respect to three data latches, in accordance with exemplary embodiments.
Figure 22:
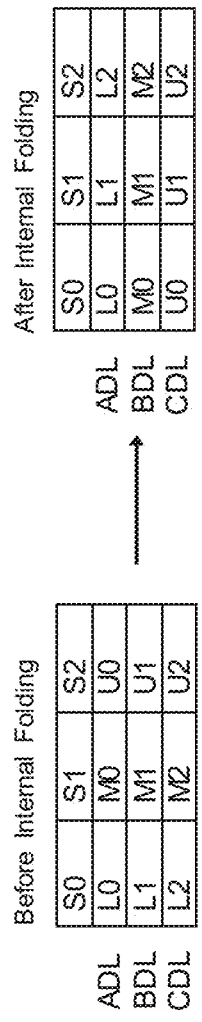
FIG. 22 depicts a sequence of before and after with respect to a rearrangement of data within several latches during an internal folding process, in accordance with exemplary embodiments.

The following provides a description of an exemplary embodiment of a data rearrangement in which three binary mode pages are rewritten into one physical page of the memory in a three-bit per cell MLC format using the register structure shown in FIG. 20. To program a three-bit page of data, the three pages of the initially written binary data needs to be read from the binary block and put into the ADL, BDL, and CDL registers, as illustrated in FIG. 21. To begin the process, at the top line, a first binary page (page 0) is sensed by the sense amplifiers and the result is stored in an XDL register (or latch) wherein the results for sections 0, 1, and 2 (S0, S1, and S2) are designated as L0, M0, and U0, corresponding to the lower, middle, and upper pages into which they will be rearranged. Next, this data is transferred from the XDL register into the ADL register of each stack. Thereafter, the second binary page (page 1) is similarly written onto the XDL register and transferred to the BLD register of each stack. The same process follows for the third binary page (page 2) where it ultimately is stored in the CDL register of each stack. The binary data contents of the ADL, BDL, and CDL registers at the completion of this process is depicted on the left side of the chart representation in FIG. 22. To finish the folding operation, the data must be rearranged to achieve the placement shown on the right side of FIG. 22, wherein the lower, middle, and upper data for each section is now respectively in the ADL, BDL, and CLD registers of that section. Therefore, this transposing of elements is done by transferring the data between the sections using the LBus 951 that connects the three sections as shown in FIG. 20. Continuing on, the rest of the binary pages 0, 1, 2 will similarly be read into the ADL, BDL, and CLD registers of the other sections and folded within each subset of the sections. Once the folding operation is complete, the data can then be programmed into a word line of a MLC (or TLC) block as the lower, middle, and upper pages. FIGS. 23A-23M illustrate an exemplary embodiment of one possible data folding sequence to produce this desired result. After reading the binary page data, the data latches have the initial data as shown in FIG. 23A, where XDL and the latch of the sense amps (SA) still hold the data of the last page read. In the first pair of steps, U0 is moved from ADL of section 2 (S2) to the XDL of section 0 (S0) (see FIG. 23B) and U1 is moved from S2's BDL latch to the XDL of section 1 (S1) (see FIG. 23C) through the intra-section transfers using the local internal data bus (LBus) between the internal stack buses. As the upper page units complete in XDL for all the sections (S0, S1, S2), they are then shifted up into CDL (see FIG. 23D). Further, the content of the BDL latch is shifted into the latch in the stack processing circuit (i.e., YBOX) (see FIG. 23E). With respect to the middle page, the data therein is shafted into XDL from ADL of S1 (see FIG. 23F), the SA latch of S1 (see FIG. 23G), and the BDL latch of S1 (see FIG. 23H). The middle page is then shifted up to the BDL latches (see FIG. 23I). Finally, the data corresponding to the lower page is then shifted into XDL from the SA latch of S0 (see FIG. 23J), the YBOX latch of S0 (see FIG. 23K), and the ADL latch of S0 (see FIG. 23L). And lastly, the lower page is shifted up to the ADL latches (see FIG. 23M). After these steps, the data is thus rearranged and can be programmed into the three-bit per cell MLC blocks.

In addition to the greater complexity that is discussed above with respect to MLC and TLC-type memory cells in comparison to SLC-type memory cells, the advancement into three-dimensional memory structures also presents certain technical challenges. For example, the occurrence rate of failure modes or error conditions in a three-dimensional memory structure is likely to be greater than in a two-dimensional memory due to the proximity (or density) of components near the stacked memory cells in both the vertical and horizontal directions. Also, the intricateness in producing the small three-dimensional memory structures increases the risk that a memory die or block, or an individual memory cell (i.e., at the transistor level), will be faulty. The current techniques for identifying or detecting a faulty chip component of a flash memory product rely on, for example, memory die screening processes that are primarily conducted at the mount level such that an entire flash package (e.g., a ball grid array (BGA) package) may be rejected even in the case of the package containing only a single faulty die. Accordingly, a substantial number of healthy dies may be unknowingly relegated to waste as a result of this overarching approach. Further, such failures or defects are oftentimes not evident when data is initially written in the memory and verified as being within pre-set acceptable error limits or thresholds, and only become apparent when the data is later read by a host device. At that point in time, the faulty component can lead to a catastrophic system failure that could compromise, for example, an entire solid-state drive. Thus, it would be advantageous to be able to recognize, in situ, a faulty memory component on, for example, a die-by-die level, during a routine memory operation and to provide a system-level countermeasure to a recognized victim die that will bypass or otherwise permit the continued memory operations irrespective of the presence of the victim die.

Figure 24:
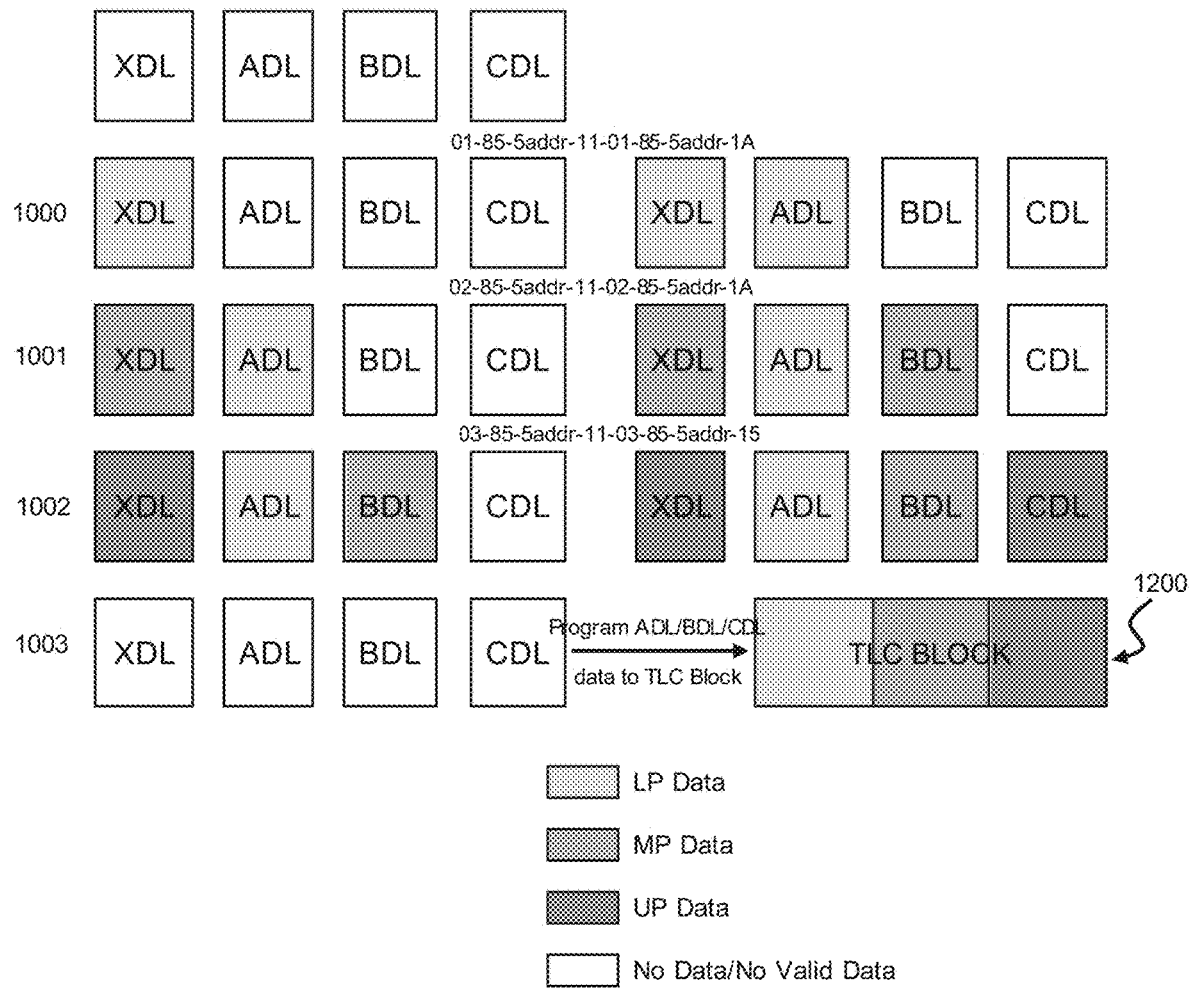
FIG. 24 schematically depicts a TLC programming operation using a series of data latches, in accordance with exemplary embodiments.

FIGS. 24-28 describe a mechanism for identifying one or more faulty memory dies during a routine programming operation of a TLC memory device in which the identification mechanism is made possible by utilizing just the normal operation of data latches customarily employed to carry out such a programming operation. Accordingly, although a TLC memory programming operation is used as the backdrop in this example for purposes of illustration, the disclosed mechanism is applicable to any memory structure in which data latches are used for conducting memory operations and is not specific (or limited) to a TLC memory architecture. Beginning at FIG. 24, depicted is a diagram of a regular TLC programming operation according to an exemplary embodiment thereof. In this particular embodiment, a transfer latch XDL and latches ADL, BDL, and CDL are used to program data into a TLC block 1200 of a multi-state memory structure, such as a three-dimensional NAND memory array. As described in greater detail above, in a first step (shown at line 1000), the XDL is populated with lower page (LP) data, which data is then transferred to the ADL. Next, as shown at line 1001, the XDL is populated with middle page (MP) data, which data is then transferred to the BDL. Continuing on, as shown at line 1002, the XDL is populated with upper page (UP) data, which data is then transferred to the CDL. Sensing of the data may be either through a SLC source block in connection with a SLC-to-TLC folding operation (as described in detail above) or through direct operation if the TLC memory structure is capable of direct write. Once the data is suitably organized within the data latches for transfer to the TLC block 1200, the TLC block is programmed.

Figure 25:
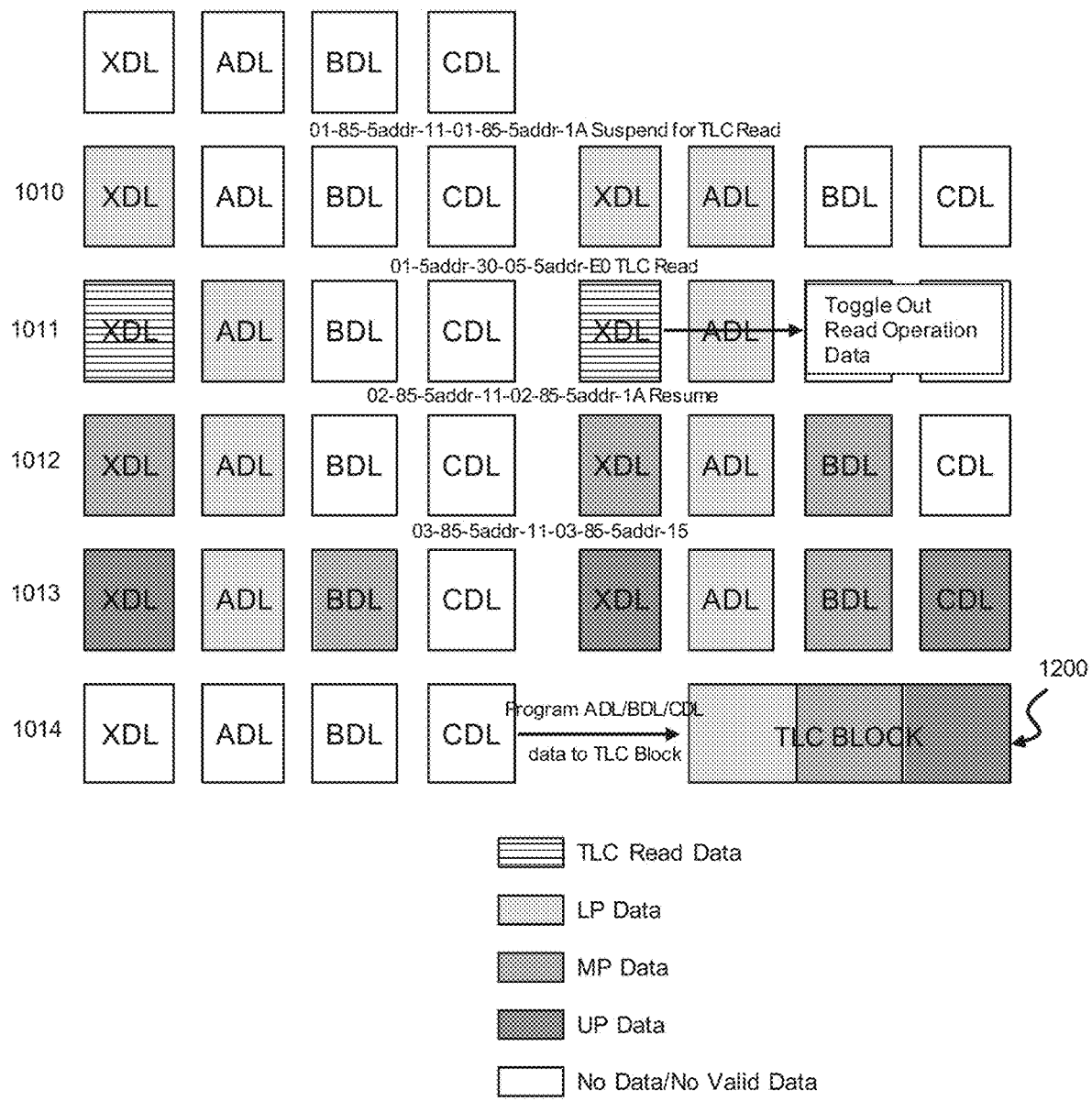
FIG. 25 schematically depicts the TLC programming operation of FIG. 24 with the introduction of a program suspend command and read operation and the anticipated behavior resulting therefrom when no faulty die is present, in accordance with exemplary embodiments.

By introducing a program suspend for read operation command into this programming sequence, it is possible to identify the presence of a faulty die within the memory array due to an anomaly that occurs within the data that is transferred from the XDL to the ADL during the read operation. The diagram in FIG. 25 illustrates the expected behavior according to a program suspend and read operation in the case in which no faulty die is present within the cells to be programmed. As indicated at line 1010, the XDL is first populated with lower page (LP) data, which data is transferred to the ADL. At this point, a program suspend command is issued. At line 1011, a read operation commences and the XDL is populated with TLC read data which, if operating with a healthy die, should not migrate to the ADL. Accordingly, by performing a comparison between the data in the XDL and ADL to ensure that the previously transferred LP data is still present in the ADL (in other words, that the content of the XDL and ADL are not identical), a determination can be made if a faulty die is present. Thus, once a determination is made that the die is operating as anticipated, the TLC read data is toggled out of the XDL and programming can resume (shown at line 1012). As such, the process continues through the population of the MP and UP data in the XDL latch and transfer to the BDL and CDL latches, respectively (see lines 1012 and 1013). Subsequently, the data within the ADL, BDL, and CDL is programmed to the TLC block 1200 as intended (shown in line 1014).

Figure 26:
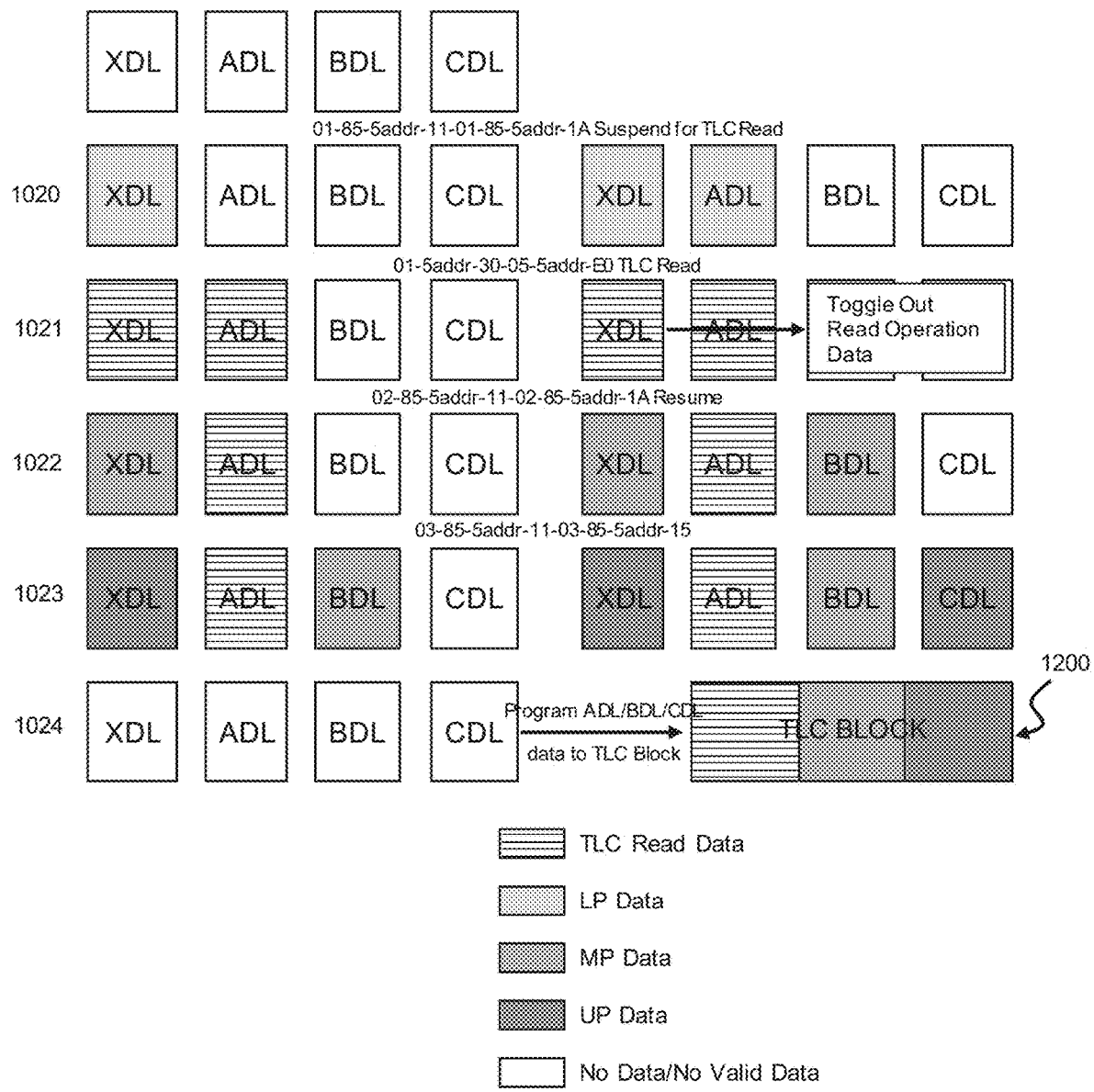
FIG. 26 schematically depicts the TLC programming operation of FIG. 25, but in the case in which a faulty die is present leading to a XDL overwrite of the ADL data, in accordance with exemplary embodiments.
Figure 27:
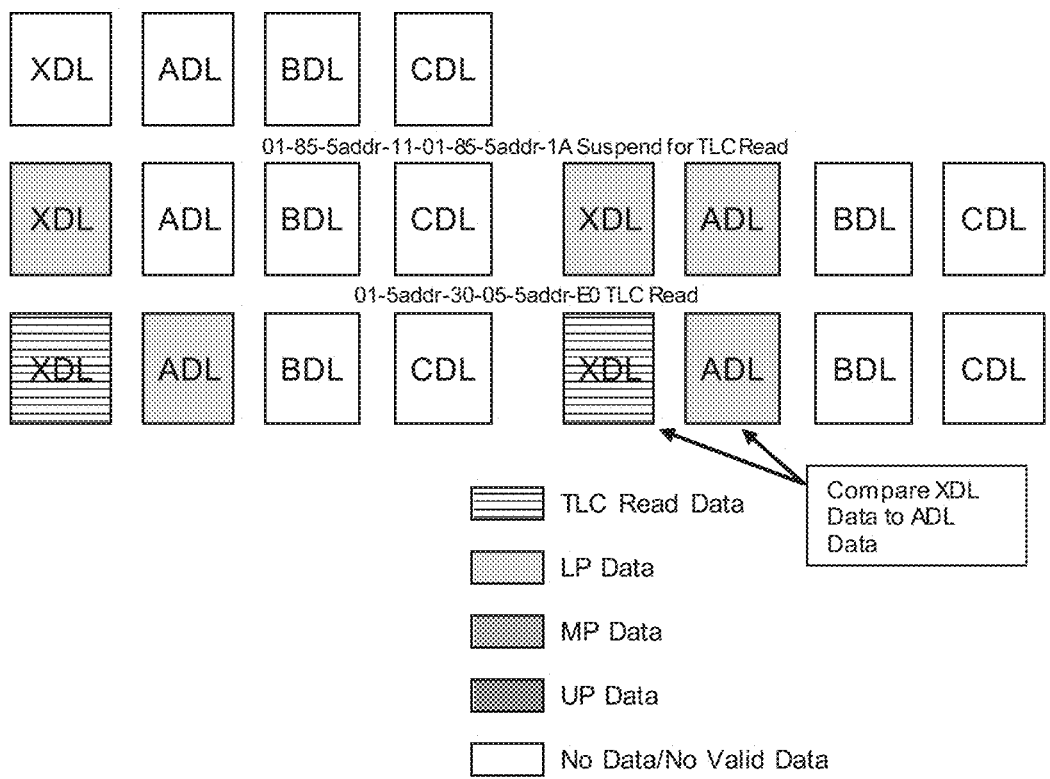
FIG. 27 schematically depicts a process for identifying a faulty die during the TLC programming operation of FIG. 25, in accordance with exemplary embodiments.

By contrast, the diagram in FIG. 26 illustrates the abnormal behavior of the data write during a program suspend and read operation as a result of a faulty die. In this case, following transfer of the LP data from the XDL and into the ADL (see line 1020), issuance of a program suspend command and read operation and, toggling out of the TLC read data from the XDL, a comparison of the data in the XDL and ADL reveals that the LP data previously contained in the ADL has summarily been overwritten with the TLC read data such that the content of the XDL and ADL are now identical. As a consequence, in the event that the programming operation resumes without addressing this failure, the TLC read data continues to reside in the ADL (see lines 1022 and 1023) and, at the point in time when programming of the data within the ADL, BDL, and CDL latches to the TLC block 1200 occurs, the TLC read data will be written to (and carry into) the lower bit value of the TLC block 1200 (see line 1024). Therefore, although the TLC program appears to have been conducted without incident, a corruption of the data has occurred and only when the host device subsequently reads the programmed data, will there be a failure during the mis-compare read, which is a condition that could potentially cause a critical failure of the entire drive.

Figure 28:
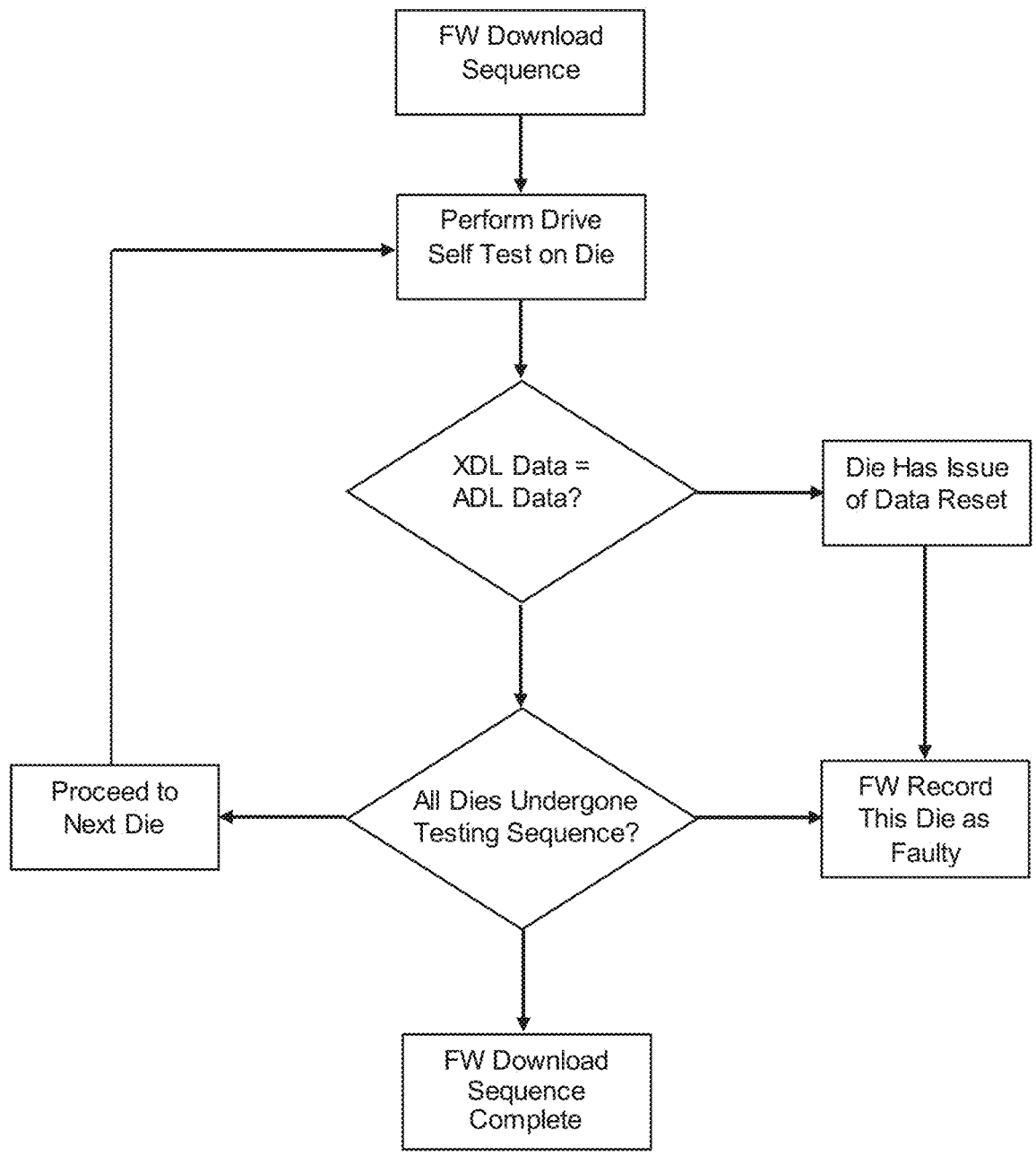
FIG. 28 is a flow diagram illustrating the principle steps in a process for identifying a faulty die, in accordance with exemplary embodiments.

Accordingly, because a faulty die may be traced to this detectable anomaly during a normal programming operation (e.g., can be conducted as part of a firmware (FW) download routine or at any stage after the drive build), this provides an opportunity to identify and resolve the condition prior to it becoming a significant issue with respect to both the operation and reliability of the memory device. Therefore, as demonstrated in FIG. 27, by issuing a compare instruction of the XDL and ADL content during a read operation following a program suspend, the result thereof provides an efficient determination as to the health of the subject die. Accordingly, FIG. 28 is a flow diagram that illustrates this comparison procedure as performed during a firmware download routine according to an exemplary embodiment. As indicated, according to this particular embodiment, the identification procedure may be repeated for every memory die comprising the memory array.

Figure 29:
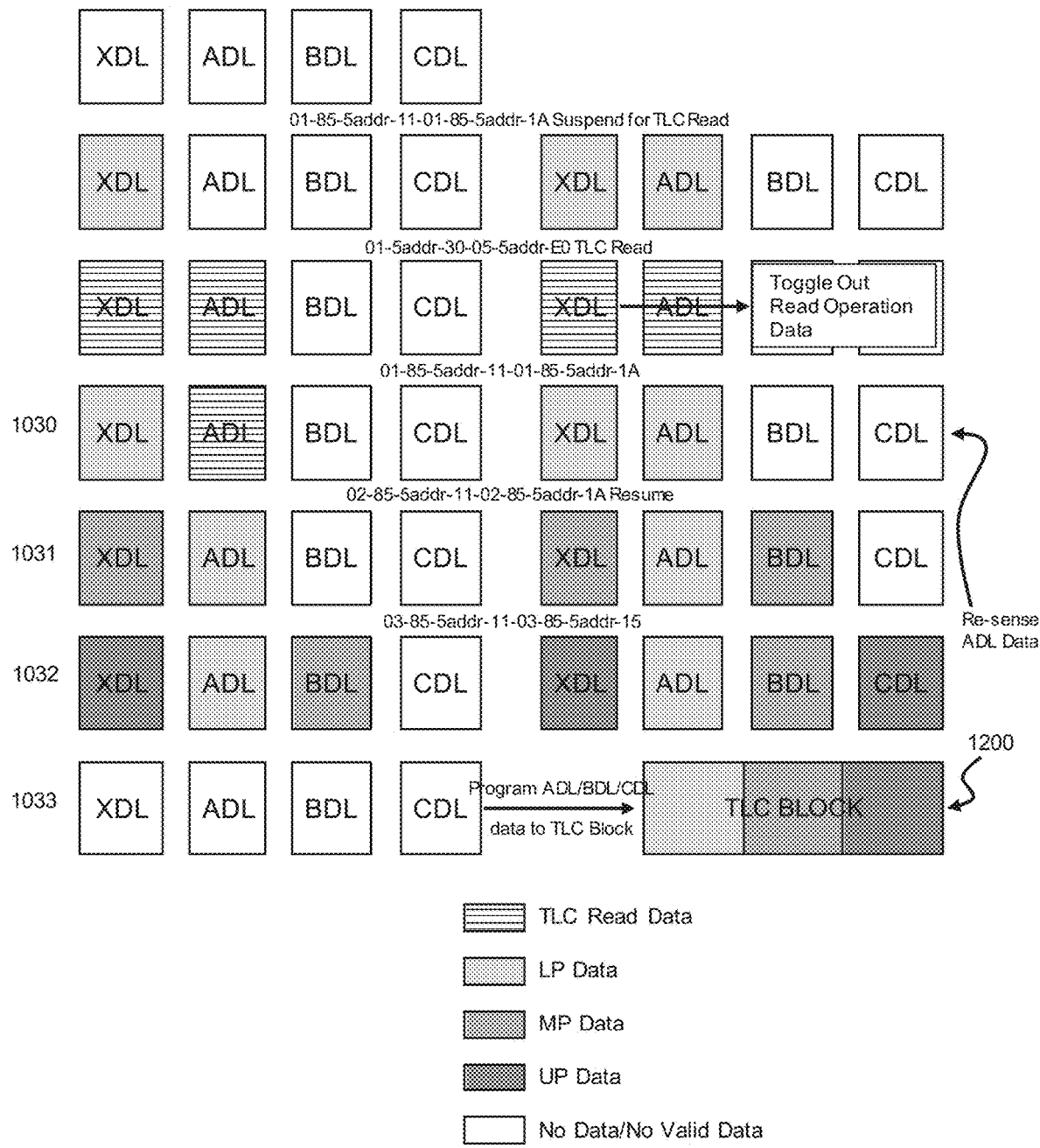
FIG. 29 schematically depicts a system countermeasure in the case of FIGS. 26 and 27 in which a faulty die is present and identified, in accordance with exemplary embodiments.

Importantly, once a faulty or victim die is identified according to the process described above, a system-level countermeasure may be applied to correct the errant data overwrite in the ADL latch. As an initial step, the control algorithm for the programming operation should be modified to not issue a program suspend and read operation according to the same sequence. In this way, the overwrite symptom can be avoided in a predictive manner. However, depicted in FIG. 29 is an exemplary embodiment of a countermeasure for re-populating the XDL with the correct LP data and again transfer the data from XDL to the ADL latch (see line 1030) should the fault die encounter a scenario in which there is a read during a program suspend operation. Accordingly, once the ADL is populated with the correct data, the programming sequence can continue as intended (see lines 1031, 1032, and 1033). In a system in which the programming operation is conducted according to a folding operation, this countermeasure can be achieved by re-sensing the SLC source block and page to get the correct data into the XDL after the TLC read during suspend. Conversely, in a system in which the programming operation is conducted according to a direct write, this countermeasure can be achieved by re-loading the buffer into the XDL.

The above discussion is meant to be illustrative of the principles and various embodiments of the present invention. Numerous variations and modifications will become apparent to those skilled in the art once the above disclosure is fully appreciated. For example, although on-memory controllers have been described as performing or controlling the methods that are described above, any processor executing software within a host system can perform the methods described above without departing from the scope of the disclosure. In particular, the methods and techniques described herein as performed in the on-memory controller(s), may also be performed in a host. Furthermore, the methods and concepts disclosed herein may be applied to other types of persistent memories other than flash. It is intended that the following claims be interpreted to embrace all such variations and modifications.

What is claimed is:

1. A method for identifying a faulty memory die in a non-volatile memory storage system, comprising:
commencing a programming operation of a multi-state block of a subject memory die, wherein the multi-state block includes a transfer data latch (XDL) and at least a first data latch and a second data latch, the programming operation comprising:
populating the transfer data latch (XDL) with a first set of data and transferring the first set of data to the first data latch;
populating the transfer data latch (XDL) with a second set of data and transferring the second set of data to the second data latch;
arranging the first and second sets of data in a suitable format of the multi-state block; and
writing the first and second sets of data to the multi-state block;
performing a program suspend and read operation after the transferring of the first set of data to the first data latch and before the populating of the transfer data latch (XDL) with the second set of data, thereby populating the transfer data latch (XDL) with a set of read data;
comparing the read data contained in the transfer data latch (XDL) and the data contained in the first data latch; and
if the data contained in the first data latch matches the read data, identifying the subject memory die as faulty.

2. The method claim 1, further comprising:
if the data contained in the first data latch does not match the read data, resuming:
populating the transfer data latch (XDL) with the second set of data and transferring the second set of data to the second data latch;
arranging the first and second sets of data in a suitable format of the multi-state block; and
writing the first and second sets of data to the multi-state block.

3. The method of claim 1, wherein the programming operation is performed according to a single-level cell (SLC) to multi-state cell folding operation.

4. The method of claim 3, further comprising:
if the subject memory die is identified as faulty:
re-sensing a SLC source block of the subject memory die, to thereby re-populate the transfer data latch (XDL) with the first set of data;
transferring the first set of data to the first data latch; and
resuming:
populating the transfer data latch (XDL) with the second set of data and transferring the second set of data to the second data latch;
arranging the first and second sets of data in a suitable format of the multi-state block; and
writing the first and second sets of data to the multi-state block.

5. The method of claim 1, wherein the programming operation is performed according to a multi-state direct write operation.

6. The method of claim 5, further comprising:
if the subject memory die is identified as faulty:
reloading a buffer into the transfer data latch (XDL), to thereby re-populate the transfer data latch (XDL) with the first set of data;
transferring the first set of data to the first data latch; and
resuming:
populating the transfer data latch with the second set of data and transferring the second set of data to the second data latch;
arranging the first and second sets of data in a suitable format of the multi-state block; and
writing the first and second sets of data to the multi-state block.

7. The method of claim 1, wherein the multi-state block is a triple-level cell (TLC) memory block such that:
the first data latch is an ADL latch;
the second data latch is a BDL latch; and
the programming operation further comprises:
after transferring the second set of data to the second data latch, populating the transfer data latch (XDL) with a third set of data and transferring the third set of data to a third data latch (CDL) of the TLC block;
arranging the first, second, and third sets of data in a suitable format of the TLC block; and
writing the first, second, and third sets of data to the TLC block.

8. A memory controller, comprising:
a first port configured to couple to a memory array, the memory array comprising at least one subject memory die having a multi-state block, wherein the multi-state block includes a transfer data latch (XDL) and at least a first data latch and a second data latch;

the memory controller configured to:
transmit a program command to the multi-state block to:
populate the transfer data latch (XDL) with a first set of data and transfer the first set of data to the first data latch;
populate the transfer data latch (XDL) with a second set of data and transfer the second set of data to the second data latch;
arrange the first and second sets of data in a suitable format of the multi-state block; and
write the first and second sets of data to the multi-state block;
transmit a program suspend and read command after the first set of data is transferred to the first data latch and before the transfer data latch (XDL) is populated with the second set of data, thereby populating the transfer data latch (XDL) with a set of read data;
compare the read data contained in the transfer data latch (XDL) and the data contained in the first data latch; and
identify the subject memory die as faulty if the data contained in the first data latch matches the read data.

9. The memory controller of claim 8, wherein if the data contained in the first data latch does not match the read data, the memory controller resumes the program command to:
populate the transfer data latch (XDL) with the second set of data and transfer the second set of data to the second data latch;
arrange the first and second sets of data in a suitable format of the multi-state block; and
write the first and second sets of data to the multi-state block.

10. The memory controller of claim 8, wherein the program command is according to a single-level cell (SLC) to multi-state cell folding operation.

11. The memory controller of claim 10, wherein if the subject memory die is identified as faulty, the memory controller is configured to:
re-sense a SLC source block of the subject memory die, to thereby re-populate the transfer data latch (XDL) with the first set of data;
transfer the first set of data to the first data latch; and
resume:
populating the transfer data latch (XDL) with the second set of data and transferring the second set of data to the second data latch;
arrange the first and second sets of data in a suitable format of the multi-state block; and
write the first and second sets of data to the multi-state block.

12. The memory controller of claim 8, wherein the program command is according to a multi-state direct write operation.

13. The memory controller of claim 12, wherein if the subject memory die is identified as faulty, the memory controller is configured to:
reload a buffer into the transfer data latch (XDL), to thereby re-populate the transfer data latch (XDL) with the first set of data;
transfer the first set of data to the first data latch; and
resume:
populating the transfer data latch (XDL) with the second set of data and transferring the second set of data to the second data latch;
arrange the first and second sets of data in a suitable format of the multi-state block; and
write the first and second sets of data to the multi-state block.

14. The memory controller of claim 8, wherein the multi-state block is a triple-level cell (TLC) memory block such that:
the first data latch is an ADL latch;
the second data latch is a BDL latch; and
the memory controller is configured to:
after transferring the second set of data to the second data latch, populate the transfer data latch (XDL) with a third set of data and transfer the third set of data to a third data latch (CDL) of the TLC block;
arrange the first, second, and third sets of data in a suitable format of the TLC block; and
write the first, second, and third sets of data to the TLC block.

15. A non-volatile memory system, configured to identify a faulty memory die thereof, comprising:
a memory array storing data in a multi-state block of a subject memory die of the memory array, wherein the multi-state block is programmed using a transfer data latch (XDL) and at least a first data latch and a second data latch; and
a controller coupled to the memory array, wherein the controller is configured to:
transmit a program command to the multi-state block to:
populate the transfer data latch (XDL) with a first set of data and transfer the first set of data to the first data latch;
populate the transfer data latch (XDL) with a second set of data and transfer the second set of data to the second data latch;
arrange the first and second sets of data in a suitable format of the multi-state block; and
write the first and second sets of data to the multi-state block;
transmit a program suspend and read command after the first set of data is transferred to the first data latch and before the transfer data latch (XDL) is populated with the second set of data, thereby populating the transfer data latch (XDL) with a set of read data;
compare the read data contained in the transfer data latch (XDL) and the data contained in the first data latch; and
identify the subject memory die as faulty if the data contained in the first data latch matches the read data.

16. The non-volatile storage system of claim 15, wherein if the data contained in the first data latch does not match the read data, the memory controller is configured to resume the program command to:
populate the transfer data latch (XDL) with the second set of data and transfer the second set of data to the second data latch;
arrange the first and second sets of data in a suitable format of the multi-state block; and
write the first and second sets of data to the multi-state block.

17. The non-volatile storage system of claim 15, wherein the program command is according to a single-level cell (SLC) to multi-state cell folding operation.

18. The non-volatile storage system of claim 17, wherein if the subject memory die is identified as faulty, the memory controller is configured to:
- re-sense a SLC source block of the subject memory die, to thereby re-populate the transfer data latch (XDL) with the first set of data;
- transfer the first set of data to the first data latch; and
- resume:
  - populating the transfer data latch (XDL) with the second set of data and transferring the second set of data to the second data latch;
  - arrange the first and second sets of data in a suitable format of the multi-state block; and
  - write the first and second sets of data to the multi-state block.

19. The non-volatile storage system of claim 15, wherein the program command is according to a multi-state direct write operation.

20. The non-volatile storage system of claim 19, wherein if the subject memory die is identified as faulty, the memory controller is configured to:
- reload a buffer into the transfer data latch (XDL), to thereby re-populate the transfer data latch (XDL) with the first set of data;
- transfer the first set of data to the first data latch; and
- resume:
  - populating the transfer data latch (XDL) with the second set of data and transferring the second set of data to the second data latch;
  - arrange the first and second sets of data in a suitable format of the multi-state block; and
  - write the first and second sets of data to the multi-state block.

* * * * *